(12) United States Patent
Kubo et al.

(10) Patent No.: US 8,018,762 B2
(45) Date of Patent: Sep. 13, 2011

(54) INFORMATION RECORDING AND REPRODUCING APPARATUS

(75) Inventors: Kohichi Kubo, Kanagawa-ken (JP); Chikayoshi Kamata, Kanagawa-ken (JP); Takayuki Tsukamoto, Kanagawa-ken (JP); Shinya Aoki, Kanagawa-ken (JP); Takahiro Hirai, Kanagawa-ken (JP); Toshiro Hiraoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 61 days.

(21) Appl. No.: 12/636,606

(22) Filed: Dec. 11, 2009

(65) Prior Publication Data

US 2010/0142261 A1    Jun. 10, 2010

Related U.S. Application Data

(63) Continuation of application No. PCT/JP2008/060775, filed on Jun. 12, 2008.

(30) Foreign Application Priority Data

Jun. 12, 2007  (JP) .................................. 2007-155709

(51) Int. Cl.
G11C 11/00    (2006.01)
(52) U.S. Cl. .................... 365/163; 365/148; 365/189.14
(58) Field of Classification Search .................. 365/163, 365/148, 189.09, 189.14, 230.06, 100, 105
See application file for complete search history.

(56) References Cited

U.S. PATENT DOCUMENTS

| | | | | |
|---|---|---|---|---|
| 7,701,750 B2 * | 4/2010 | Shih et al. | ..................... | 365/148 |
| 7,859,885 B2 * | 12/2010 | Toda | ............................. | 365/148 |
| 7,876,626 B2 * | 1/2011 | Mukai et al. | ............. | 365/189.14 |
| 7,898,840 B2 * | 3/2011 | Maejima | ........................ | 365/148 |
| 2007/0063180 A1 | 3/2007 | Asano et al. | | |
| 2010/0238701 A1 * | 9/2010 | Tsukamoto et al. | .......... | 365/148 |

FOREIGN PATENT DOCUMENTS

JP    2004-185756    7/2004
(Continued)

OTHER PUBLICATIONS

Office Action issued Feb. 15, 2011, in Japan Patent Application No. 2007-155709 (with English-language Translation).

(Continued)

*Primary Examiner* — Gene N Auduong
(74) *Attorney, Agent, or Firm* — Oblon, Spivak, McClelland, Maier & Neustadt, L.L.P.

(57) ABSTRACT

An information recording and reproducing apparatus, includes: a stacked structure including an electrode layer and a recording layer; a buffer layer added to the electrode layer; and a voltage application unit configured to apply a voltage to the recording layer, produce a phase change in the recording layer, and record information. The recording layer includes a first layer including a first compound having an ilmenite structure represented by $A_xM_yX_3$ ($0.1 \leq x \leq 1.1$ and $0.75 \leq y \leq 1$), the A and the M being mutually different elements, at least one selected from the A and the M being a transition element having a d orbit incompletely filled by electrons, the A being an element including at least one selected from the group consisting of Be, Mg, Fe, Co, Ni, Cu, and Zn, the M being an element including at least one selected from the group consisting of Ti, Ge, Sn, V, Cr, Mn, Fe, Co, Ni, Nb, Ta, Mo, W, Re, Ru, and Rh, the X being an element including at least one selected from the group consisting of O (oxygen) and N (nitrogen).

14 Claims, 23 Drawing Sheets

FOREIGN PATENT DOCUMENTS

| | | |
|---|---|---|
| JP | 2004-234707 | 8/2004 |
| JP | 2005-252068 | 9/2005 |
| JP | 2006-32729 A | 2/2006 |
| JP | 2006-140412 A | 6/2006 |
| JP | 2006-324480 A | 11/2006 |
| JP | 2007-073779 | 3/2007 |
| WO | WO 2005/101420 A1 | 10/2005 |
| WO | 2005-106955 | 11/2005 |

OTHER PUBLICATIONS

T. Gotoh et al.; Minimal Phase-Change Marks Produced in Amorphous Ge2Sb2Te5 Films, Jpn. J. Appl. Phys., 43, 6B. 2004, L818.

A. Sawa et al.; Hysteretic current-voltage characteristics and resistance switching at a rectifying Ti/Pr0.7Ca0.3MnO3 interface, Appl. Phys. Lett., 85, 18, 4073 (2004).

P. Vettiger et al,; The "Millipede"-Nanotechnolgoy Entering Data Storage, IEEE Trans, Nanotechnology 1, 39 (2002).

P. Vettiger et al.; Thousands of Microcantilevers for Highly Parallel and Ultra-dense Data Storage, Technical Digest, IEDMO3.

Onoe et al.; Nano-sized domain inversion characteristics in LiNbO3 group single crystals using SNDM, Mat. Sci. Eng. B120, 130 (2005).

Marquardt et al.; Crystal chemistry and electrical properties of the delafossite structure, Thin Solid Films 496 (2006) 146.

* cited by examiner

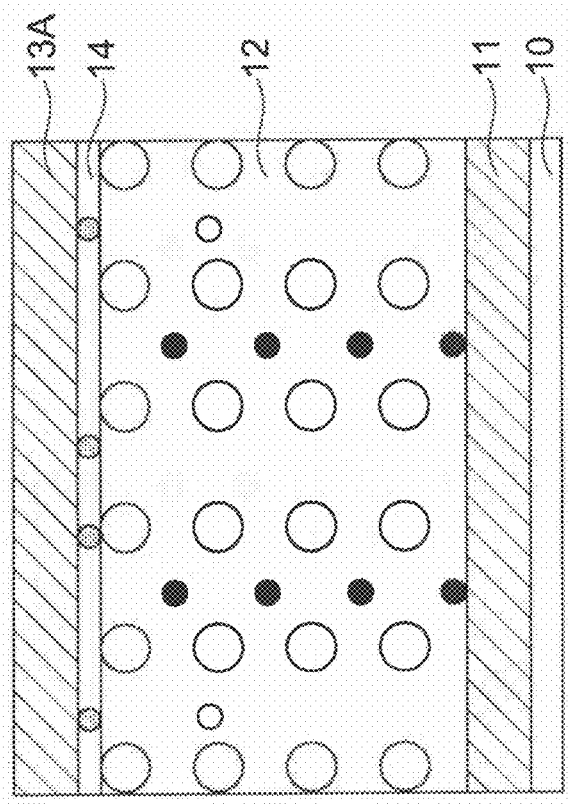
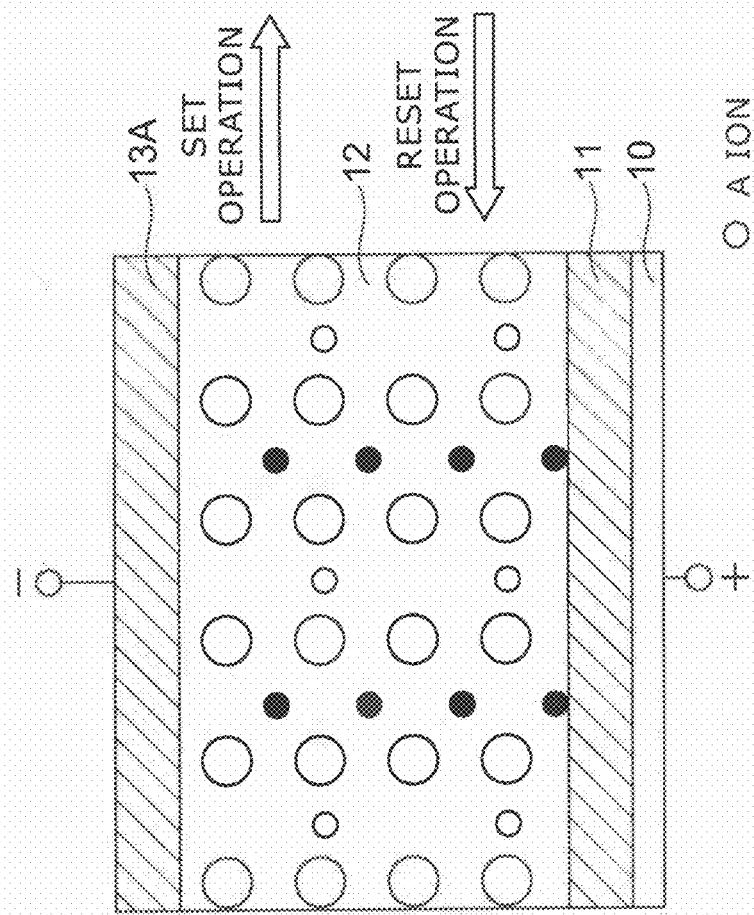

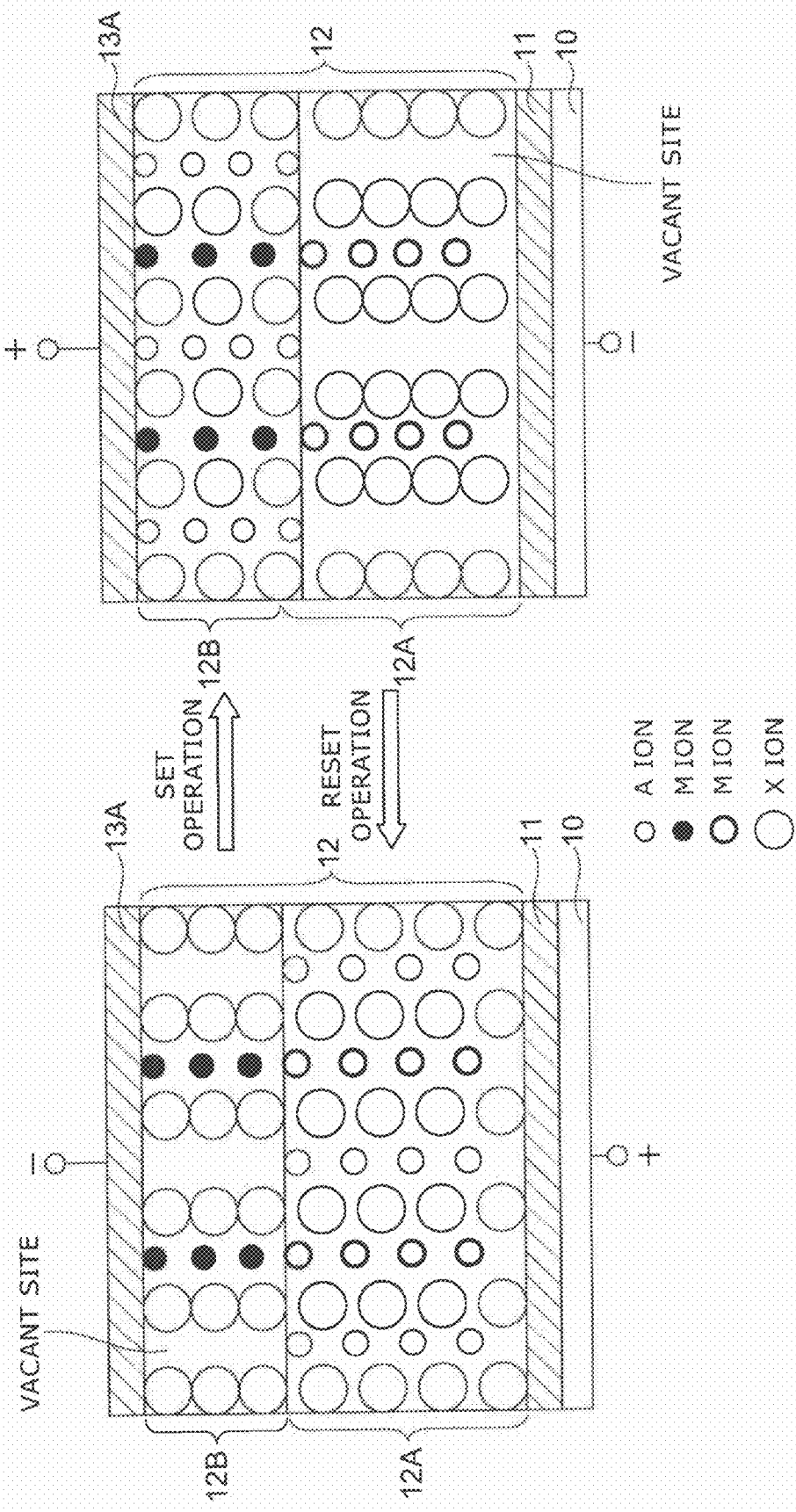

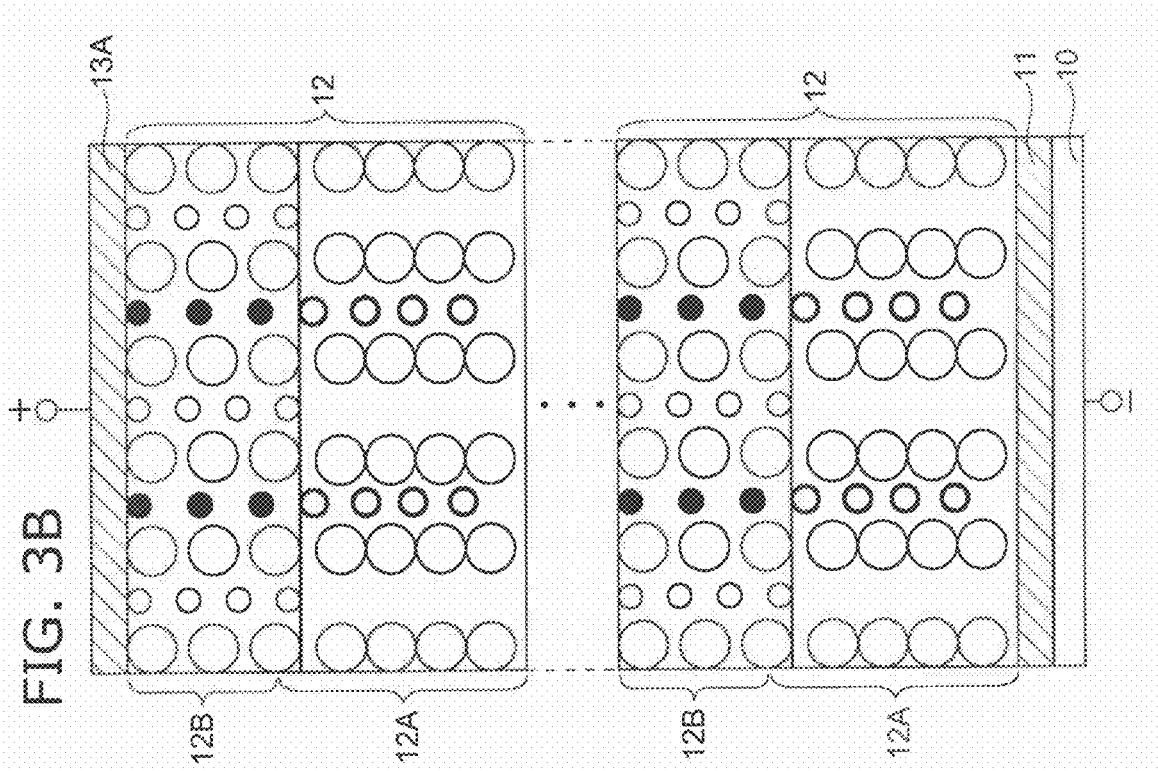
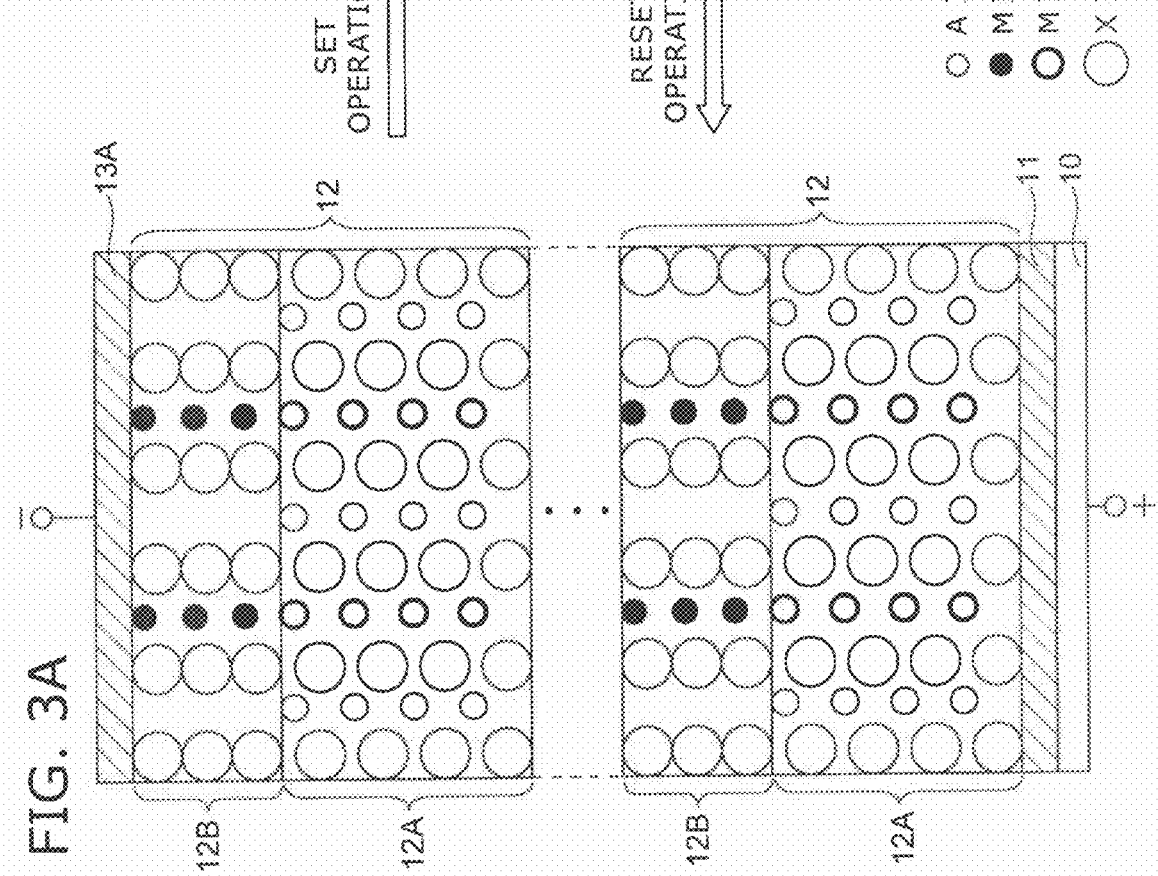

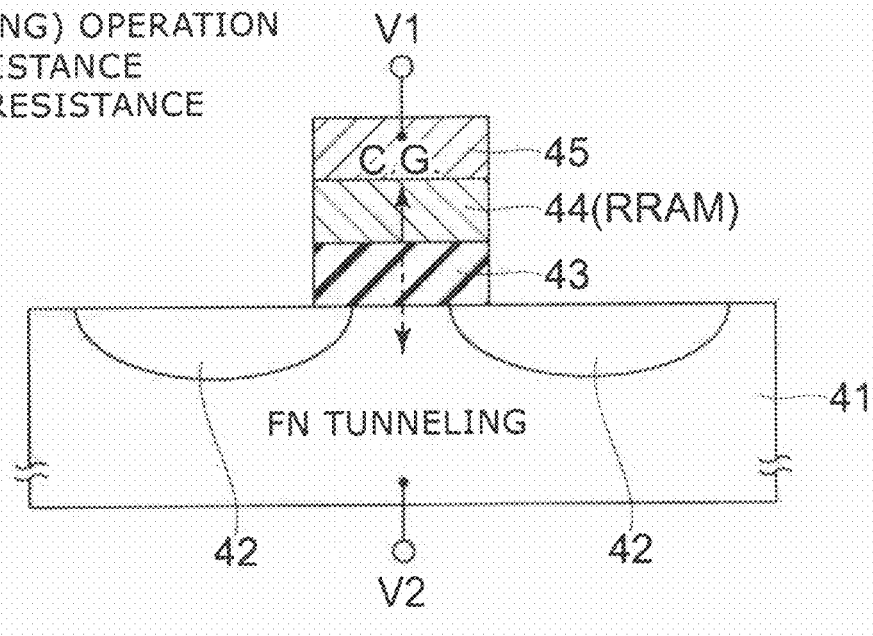
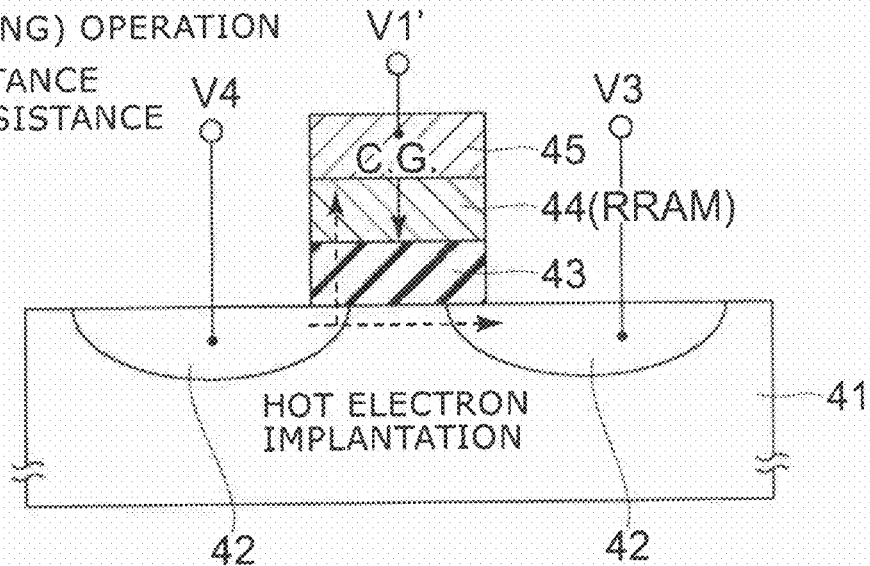
FIG. 16

| | FORM | FOUNDATION LAYER | ELECTRODE LAYER | RECORDING LAYER (OR FIRST COMPOUND) | PROTECTIVE LAYER (OR SECOND COMPOUND) | RESISTANCE VALUE Ω AFTER RECORDING | RESISTANCE VALUE Ω AFTER ERASING |
|---|---|---|---|---|---|---|---|
| FIRST EXPERIMENTAL EXAMPLE | PROBE MEMORY | CeO₂ | TiN | NiTiO₃ | DLC | 1.E+03 | 1.E+07 |
| SECOND EXPERIMENTAL EXAMPLE | PROBE MEMORY | CeO₂ | TiN | NiAl0.5Ta0.5O3 | DLC | 1.E+03 | 1.E+07 |
| THIRD EXPERIMENTAL EXAMPLE | PROBE MEMORY | CeO₂ | TiN | Ni1.1Ti0.9O3 | DLC | 1.E+03 | 1.E+07 |
| FOURTH EXPERIMENTAL EXAMPLE | PROBE MEMORY | CeO₂ | TiN | NiMnO3 | DLC | 1.E+03 | 1.E+07 |
| FIFTH EXPERIMENTAL EXAMPLE | PROBE MEMORY | CeO₂ | TiN | ZnTiO3 | DLC | 1.E+03 | 1.E+07 |
| SIXTH EXPERIMENTAL EXAMPLE | PROBE MEMORY | CeO₂ | LaNiO | ZnCo0.5Ta0.5O3 | DLC | 1.E+03 | 1.E+07 |
| SEVENTH EXPERIMENTAL EXAMPLE | PROBE MEMORY | Si₃N₄ | TiN | NiTiO3 | DLC | 1.E+03 | 1.E+07 |
| EIGHTH EXPERIMENTAL EXAMPLE | PROBE MEMORY | CeO₂ | TiN | NiCr0.5Nb0.5O3 | DLC | 1.E+03 | 1.E+07 |
| NINTH EXPERIMENTAL EXAMPLE | PROBE MEMORY | CeO₂ | TiN | NiCo0.5Ta0.5O3 | DLC | 1.E+03 | 1.E+07 |
| TENTH EXPERIMENTAL EXAMPLE | PROBE MEMORY | CeO₂ | TiN | NiAl0.5Nb0.5O3 | DLC | 1.E+03 | 1.E+07 |
| ELEVENTH EXPERIMENTAL EXAMPLE | CROSS-POINT MEMORY | CeO₂ | TiN | NiTiO3 | TiO2 | 1.E+03 | 1.E+07 |
| TWELFTH EXPERIMENTAL EXAMPLE | CROSS-POINT MEMORY | CeO₂ | TiN | NiCo0.5Ta0.5O3 | TiO2 | 1.E+03 | 1.E+04~1.E+05 |
| THIRTEENTH EXPERIMENTAL EXAMPLE | PROBE MEMORY | CeO₂ | LaNiO | NiTiO3 | SnO₂ | 1.E+03 | 1.E+02~1.E+05 |
| FOURTEENTH EXPERIMENTAL EXAMPLE | PROBE MEMORY | Tb₂O₇ | TiN | NiTiO3 | DLC | 1.E+02 | 1.E+06 |
| FIFTEENTH EXPERIMENTAL EXAMPLE | PROBE MEMORY | Ta₂O₅ | TiN | NiTiO3 | DLC | 1.E+03 | 1.E+08 |
| SIXTEENTH EXPERIMENTAL EXAMPLE | PROBE MEMORY | CeO₂ | RuO₂ | NiTiO3 | DLC | 1.E+03 | 1.E+08 |

FIG. 29

INFORMATION RECORDING AND REPRODUCING APPARATUS

CROSS-REFERENCE TO RELATED APPLICATIONS

This is a continuation application of International Application PCT/JP08/060,775, filed Jun. 12, 2008. This application also claims priority to Japanese Application No. 2007-155709, filed on Jun. 12, 2007. The entire contents of each are incorporated herein by reference.

TECHNICAL FIELD

The invention relates to an information recording and reproducing apparatus having high recording density.

BACKGROUND ART

In recent years, downsized mobile devices have spread worldwide, and simultaneously, the demand for downsized large-capacity nonvolatile memory has rapidly enlarged with the drastic progress of high-speed telecommunications networks. Therein, NAND flash memory and downsized HDDs (hard disk drives) in particular have achieved rapid advancements of recording density to form a large market.

Under such circumstances, several ideas for new memory aiming to drastically exceed the limits of recording density have been proposed. For example, PRAM (phase change memory) employs the principle of using a recording material capable of having the two states of an amorphous state (ON) and a crystalline state (OFF) and recording data by having these two states correspond to the binary data of "0" and "1."

To write/erase, for example, the amorphous state is made by applying a high-power pulse to the recording material; and the crystalline state is made by applying a low-power pulse to the recording material.

The reading is performed by providing a reading current small enough not to cause writing/erasing of the recording material and by measuring the electrical resistance of the recording material. The resistance value of the recording material of the amorphous state is greater than the resistance value of the recording material of the crystalline state, and the ratio thereof is about $10^3$.

The greatest merit of PRAM is in the point that the operation is possible even when the device size is reduced to about 10 nm; and in such a case, because a recording density of about 10 Tbpsi (terra bit per square inch) can be realized, it is considered to be one candidate to achieve high recording density (for example, refer to Non Patent Citation 1).

Also, although different from PRAM, a new memory having an extremely similar operation principle has been reported (for example, refer to Non Patent Citation 2).

According to this report, nickel oxide is a typical example of the recording material on which data is recorded, and a high-power pulse and a low-power pulse are used for the writing/erasing similarly to PRAM. In such a case, an advantage is reported that the power consumption during the writing/erasing is reduced in comparison to PRAM.

Although the operation mechanism of this new memory has not been elucidated to date, the reproducibility has been confirmed, and it is considered to be one candidate to achieve high recording density. Several groups are attempting to elucidate the operation mechanism.

In addition thereto, MEMS memory using MEMS (micro electro mechanical systems) technology has been proposed (for example, refer to Non Patent Citation 3).

In particular, a MEMS memory referred to as Millipede has a structure in which multiple cantilevers in an array configuration oppose a recording medium coated with an organic substance, and probes of the tips of the cantilevers contact the recording medium with moderate pressure.

The writing is performed by selectively controlling the temperature of heaters added to the probes. In other words, when the heater temperature increases, the recording medium softens, the probe sinks into the recording medium, and a depression is made in the recording medium.

The reading is performed by scanning with the probes over the surface of the recording medium while providing a current to the probes such as not to cause the recording medium to soften. Because the probe temperature decreases and the resistance value of the heater increases when the probe drops into a depression of the recording medium, data can be sensed by reading the change of the resistance value.

The greatest merit of MEMS memory such as the Millipede is in the point that the recording density can be drastically improved because it is not necessary to provide an interconnect to each recording unit that records the bit data. Currently, a recording density of about 1 Tbpsi has already been achieved (for example, refer to Non Patent Citation 4).

Also, since the publication of the Millipede, recently, it is being attempted to achieve large improvements of power consumption, recording density, operation speed, and the like by combining MEMS technology with new recording principles.

For example, a method is proposed to perform the recording of data by providing a ferroelectric layer to the recording medium and causing a dielectric polarization in the ferroelectric layer by applying a voltage to the recording medium. According to this method, there are theoretical predictions that the spacing between recording units recording the bit data (the minimum unit of recording) may approach the unit cell level of the crystal.

If the minimum unit of recording is one unit cell of the crystal of the ferroelectric layer, the recording density becomes the huge value of about 4 Pbpsi (peta bit per square inch).

Recently, due to the proposal of reading methods using SNDMs (scanning nonlinear dielectric microscopes), this new memory has progressed substantially toward practical use (for example, refer to Non Patent Citation 5).

Patent Citation 1: JP-A 2005-252068 (Kokai)
Patent Citation 2: JP-A 2004-234707 (Kokai)
Patent Citation 3: JP-A 2004-185756 (Kokai)
Non Patent Citation 1: T. Gotoh, K. Sugawara, and K. Tanaka, Jpn. J. Appl. Phys., 43, 6B, 2004, L818
Non Patent Citation 2: A. Sawa, T. Fuji, M. Kawasaki and Y. Tokura, Appl. Phys. Lett., 85, 18, 4073 (2004)
Non Patent Citation 3: P. Vettiger, G. Cross, M. Despont, U. Drechsler, U. Durig, B. Gotsmann, W. Haberle, M. A. Lants, H. E. Rothuizen, R. Stutz and G. K. Binnig, IEEE Trans, Nanotechnology 1, 39 (2002)
Non Patent Citation 4: P. Vettiger, T. Albrecht, M. Despont, U. Drechsler, U. Durig, B. Gotsmann, D. Jubin, W. Haberle, M. A. Lants, H. E. Rothuizen, R. Stutz, D. Weismann and G. K. Binnig, P. Bachtold, G. Cherubini, C. Hagleitner, T. Loeliger, A. Pantazi, H. Pozidis and E. Eleftheriou, in Technical Digest, IEDM03 pp. 763-766
Non Patent Citation 5: A. Onoue, S. Hashimoto, Y. Chu, Mat. Sci. Eng. B120, 130 (2005)
Non Patent Citation 6: Meagen A. Marquardt, Nathan A. Ashmore, David P. Cann, Thin Solid Films 496 (2006) 146

DISCLOSURE OF INVENTION

Problems to be Solved by the Invention

The invention provides a non-volatile information recording and reproducing apparatus having high recording density and low power consumption.

Technical Solution

According to an aspect of the invention, there is provided an information recording and reproducing apparatus, including: a stacked structure including an electrode layer and a recording layer; a buffer layer added to the electrode layer; and a voltage application unit configured to apply a voltage to the recording layer, produce a phase change in the recording layer, and record information, the recording layer including a first layer including a first compound having an ilmenite structure represented by $A_xM_yX_3$ ($0.1 \leq x \leq 1.1$ and $0.75 \leq y \leq 1$), the A and the M being mutually different elements, at least one selected from the A and the M being a transition element having a d orbit incompletely filled by electrons, the A being an element including at least one selected from the group consisting of Be, Mg, Fe, Co, Ni, Cu, and Zn, the M being an element including at least one selected from the group consisting of Ti, Ge, Sn, V, Cr, Mn, Fe, Co, Ni, Nb, Ta, Mo, W, Re, Ru, and Rh, the X being an element including at least one selected from the group consisting of O (oxygen) and N (nitrogen).

BRIEF DESCRIPTION OF DRAWINGS

FIGS. 1A and 1B are conceptual views illustrating the basic principle of recording/reproducing information in an information recording and reproducing apparatus according to a first embodiment of the invention.

FIGS. 2A and 2B are conceptual views illustrating the structure of the recording unit of a second embodiment.

FIGS. 3A and 3B are schematic views illustrating specific examples of the first and second layers 12A and 12B forming the recording layer 12 alternately stacked in multiple layers of two or more layers, respectively.

FIG. 16 is a schematic cross-sectional view illustrating a memory cell of flash memory.

FIG. 29 is a table summarizing the verification results of the first to sixteenth experimental examples.

EXPLANATION OF REFERENCE

Figure 4:
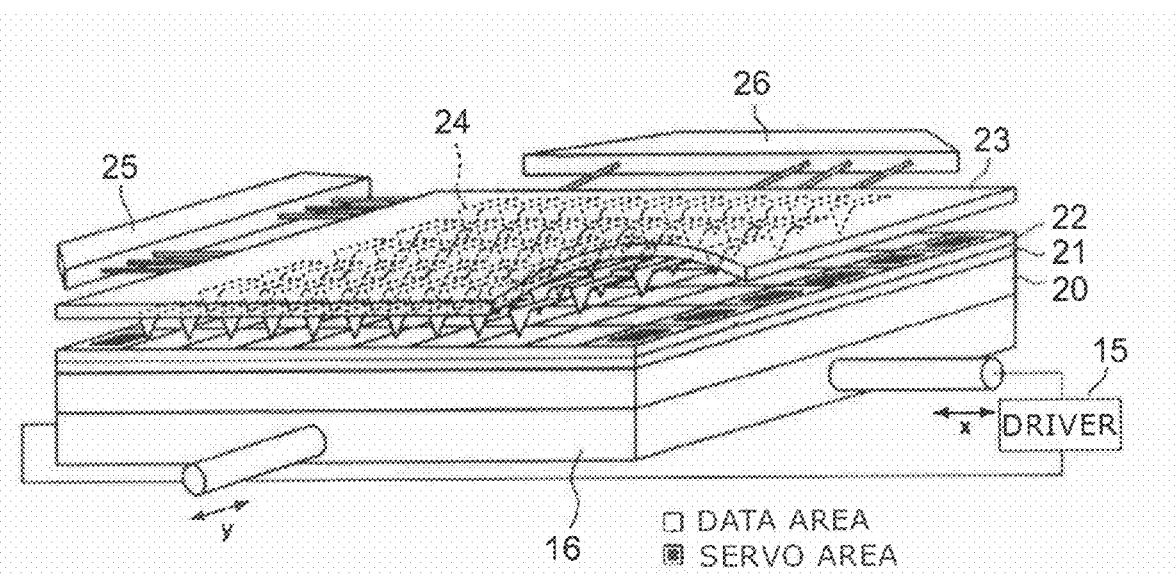
FIG. 4 is a schematic view illustrating a probe memory according to the invention.

10 buffer layer
11 electrode layer
12 recording layer
12A first layer
12B second layer
13A electrode layer (protective layer)
13B protective layer
14 metal layer
15 driver
16 scanner
20 substrate
21 electrode layer
22 recording layer
23 substrate
24 probe
25, 26 multiplex driver
27 recorded bit
30 semiconductor chip
31 decorder
32 reading circuit
33 memory cell
34 diode
35 heater layer
41 semiconductor substrate
41a P-type semiconductor substrate
41b N-type well region
41c P-type well region
42 diffusion layer
43 gate insulation layer
44 recording layer
45 control gate electrode
47 semiconductor layer

BEST MODE FOR CARRYING OUT THE INVENTION

Embodiments of the invention will now be described with reference to the drawings. Similar components in the drawings are marked with like reference numerals, and a detailed description is omitted as appropriate.

FIG. 1 is a conceptual view illustrating the basic principle of recording/reproducing information in an information recording and reproducing apparatus according to a first embodiment of the invention.

FIG. 1A is a cross-sectional view of a recording unit. The recording unit has a structure in which electrode layers 11 and 13A are disposed on either side of a recording layer 12 including a material having an ilmenite structure. Further, the recording unit has a structure in which a buffer layer 10 is added to the electrode layer 11. The recording layer 12 includes a first compound having an ilmenite structure represented by $A_x M_y X_3$ ($0.1 \leq x \leq 1.1$ and $0.75 \leq y \leq 1$), where A and M are mutually different elements, at least one selected from A and M is a transition element having a d orbit incompletely filled by electrons, A is an element including at least one selected from the group consisting of Be, Mg, Fe, Co, Ni, Cu, and Zn, M is an element including at least one selected from the group consisting of Ti, Ge, Sn, V, Cr, Mn, Fe, Co, Ni, Nb, Ta, Mo, W, Re, Ru, and Rh, and X is an element including at least one selected from the group consisting of O (oxygen) and N (nitrogen).

The electrode layer 13A may perform the role of a protective layer. In the recording unit illustrated in FIG. 1, the large white circles represent X ions (e.g., anions), the small black circles represent M ions (e.g., transition element ions), and the small white circles represent A ions (e.g., diffusion ions). Because diffusion paths of the A ions exist in straight-line configurations in the structure illustrated in FIG. 1A, it is possible to select an atom type such that the A ions easily diffuse due to an external electric field.

In the case where a voltage is applied to the recording layer 12 to produce a potential gradient in the recording layer 12, some of the A ions move in the crystal. Therefore, in this embodiment, recording of information is performed by taking the initial state of the recording layer 12 to be an insulator (high resistance phase), causing a phase change of the recording layer 12 by the potential gradient, and making the recording layer 12 conductive (low resistance phase).

First, for example, a state is made in which the potential of the electrode layer 13A is relatively lower than the potential of the electrode layer 11. In the case where a fixed potential (e.g., grounding potential) is applied to the electrode layer 11, it is sufficient to apply a negative potential to the electrode layer 13A.

At this time, some of the A ions in the recording layer 12 move to the electrode layer (cathode) 13A side, and the number of the A ions in the recording layer (the crystal) 12 relatively decreases with respect to the X ions. The A ions moving to the electrode layer 13A side receive electrons from the electrode layer 13A, precipitate as A atoms, i.e., a metal, and form a metal layer 14. Accordingly, because the A ions in a region proximal to the electrode layer 13A are reduced and behave metallically, the electrical resistance thereof greatly decreases.

The X ions in the interior of the recording layer 12 are excessive, and as a result, the valence of the A ions or the M ions remaining in the recording layer 12 increases. In the case where the A ion or the M ion is selected such that the electrical resistance decreases when the valence increases at this time, the movement of the A ions causes the electrical resistance to decrease in both the metal layer 14 and the recording layer 12, and therefore a phase change to a low resistance phase occurs for the entire recording layer. That is, an information recording (set operation) is completed.

Information reproduction can be easily performed by, for example, applying a voltage pulse to the recording layer 12 and detecting the resistance value of the recording layer 12. However, it is necessary that the amplitude of the voltage pulse is a value small enough that movement of the A ions does not occur.

It may be considered that the step described above is one type of electrolysis, an oxidizing agent is created at the electrode layer (anode) 11 side due to electrochemical oxidation, and a reducing agent is created at the electrode layer (cathode) 13A side due to electrochemical reduction.

Therefore, to return the low resistance phase to the high resistance phase, it is sufficient, for example, to perform Joule heating of the recording layer 12 by a large current pulse and facilitate an oxidation-reduction reaction of the recording layer 12. In other words, due to the Joule heat caused by the large current pulse, the A ions go back into the more thermally stable crystalline structure 12, and the initial high resistance phase (the reset operation) takes form.

Alternatively, the reset operation can be performed also by applying a voltage pulse having an orientation reversed from that during the set operation. That is, in the case where a fixed potential is applied to the electrode layer 11 similarly to during the setting, it is sufficient to apply a positive potential to the electrode layer 13A. Then, after the A atoms proximal to the electrode layer 13A provide electrons to the electrode layer 13A and become A ions, the A ions go back into the crystalline structure 12 due to the potential gradient in the recording layer 12. Thereby, because the valence of the A ions decreases to the initial value for some of the A ions for which the valence had increased, the phase changes to the initial high resistance phase.

However, to practically use this operation principle, it is necessary to confirm that the reset operation does not occur at room temperature (ensuring a sufficiently long retention time) and that the power consumption of the reset operation is sufficiently low.

The former can be accommodated by reducing the coordination number of the A ions or using the A ions with a valence of not less than two. Or, the accommodation is possible by increasing the valence of the X ions. It is favorable that the coordination number of the A ions is not more than two. It is favorable that the valence of the X ions is not less than three.

Regarding the latter, it is necessary that the A ions have a valence of not more than two to avoid causing crystal destruction; and the latter can be accommodated by finding a material having many movement paths for the A ions moving in the recording layer (the crystal) 12.

Figure 26:
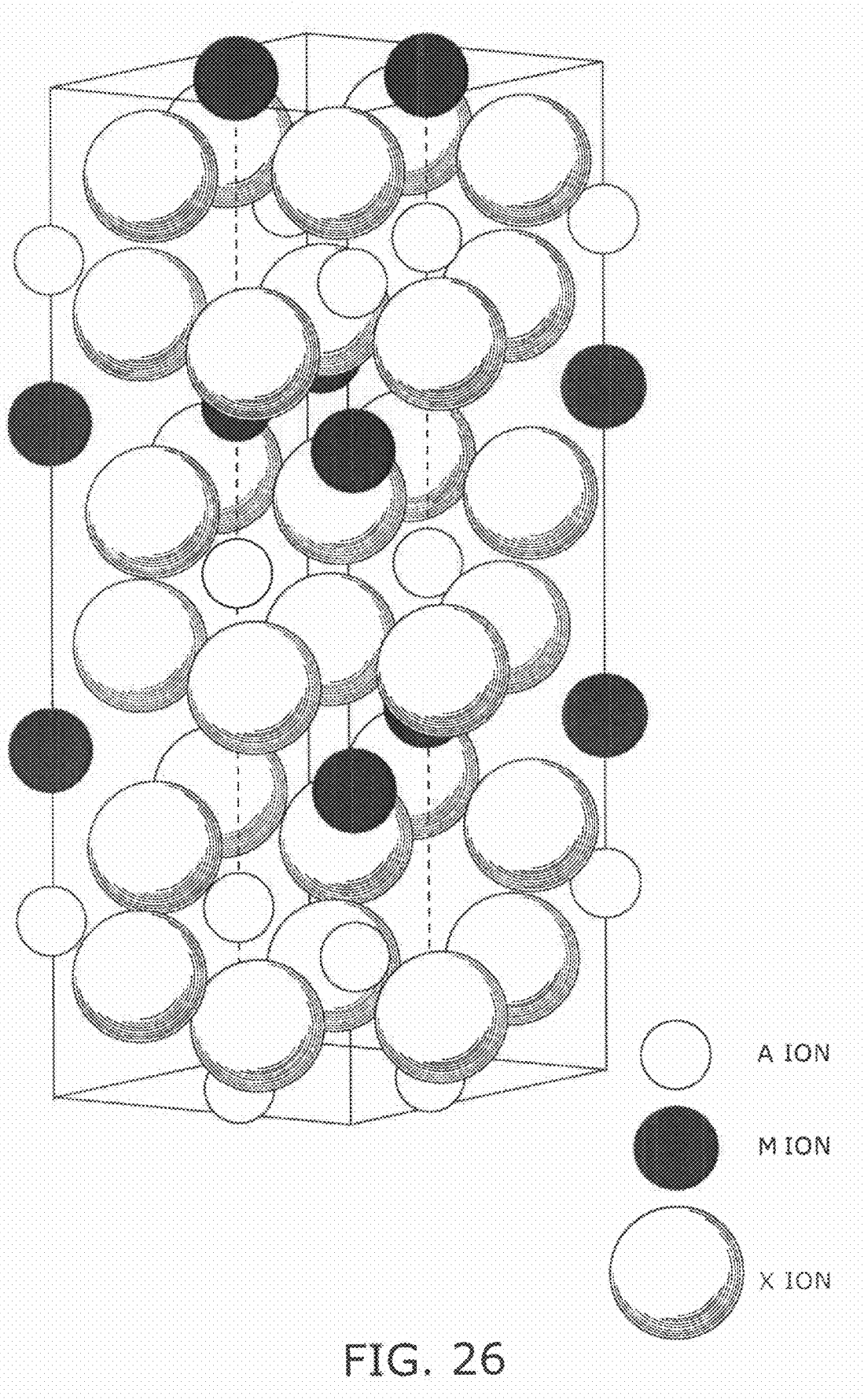
FIG. 26 is a schematic view illustrating the lattice structure of an ilmenite structure.

FIG. 26 is a schematic view illustrating the lattice structure of an ilmenite structure.

The ilmenite structure illustrated in FIG. 26 has a structure in which the A ions are respectively arranged in two dimensional planar configurations. Therefore, the ilmenite structure has movement paths of the A ions in all directions within the two dimensional plane; the A ions are bivalent and have a coordination number of six; and the ilmenite structure is suitable for use as the recording layer 12.

Further, the ilmenite structure has a structure in which the site of the A ion is formed by three one-thirds of a void from the triangular lattice; and therefore, movement to an adjacent site is easy, and switching is easy. In particular, $NiCo_{0.5}Ta_{0.5}O_3$ is excellent in regard to lattice stability, ion movability, and ease of resetting and therefore is one of the materials suitable for use as the recording layer 12.

Here, it is necessary to change the valence of either the A ions or the M ions to accompany the diffusion of the A ions. To efficiently allow the valence change to occur, it is necessary that either the A ion or the M ion is a transition element having a d orbit incompletely filled by electrons.

In the case where the A ion in particular is a transition element having a d orbit incompletely filled by electrons, neutrality conditions of charge can be satisfied after the A ions diffuse even by an increase of the valence of the A ions that remain in the crystalline structure 12 without diffusing. Particularly in the case where the valence of the M ions cannot be increased further, if all of the A ions undesirably diffuse, neutrality conditions of charge cannot be satisfied only by the M ions. Accordingly, after a certain proportion of the A ions has diffused, further diffusion of the A ions is impeded by Coulomb forces. That is, because an upper limit exists on the diffusion amount of the A ions and an upper limit exists on the valence change amount of the A ions contributing to the resistance reduction, the resistance of the low resistance state is a relatively large value. In the case where heat is applied to the recording layer to cause the A ions to move and go back into the main structure as in the reset step described above, a larger resistance of the low resistance state enables heat to be efficiently produced, enables power consumption reduction, and therefore is favorable.

It is desirable that the recording layer 12 including an ilmenite structure material has a structure in which the c axis of the crystal is oriented in a horizontal direction with respect to the film surface or within 45 degrees from the horizontal direction.

Further, it is desirable that A is an element including at least one selected from the group consisting of Ni, Zn, and Mg and M is an element or a compound including at least one selected from the group consisting of group 7 and group 8 elements such as Mn, $Co_{0.5}Nb_{0.5}$, $Co_{0.5}Ta_{0.5}$, $Fe_{0.5}Nb_{0.5}$, and $Fe_{0.5}Ta_{0.5}$. This is because this condition provides a state in which the reset operation easily occurs because the energy difference is larger before and after the information recording (the set operation) and the energy level of the state after the set operation is higher. In other words, it is more desirable because the power consumption is drastically reduced during the reset operation.

The molar ratios x and y of the ilmenite structure material represented by $A_xM_yX_3$ ($0.1 \leq x \leq 1.1$ and $0.75 \leq y \leq 1$) are values set such that the lower limits of the value ranges are values to maintain the crystalline structure and the upper limits control the electron states in the crystal.

It is desirable that the molar ratio x is, for example, about 5 to 10% greater than the molar ratio y. This condition is because, although some mutual mixing of elements between the A sites and the M sites cannot be avoided in an actual system, the M ions greatly impede the movement of the A ions when the M ions, which do not easily move into the A sites, mix. Conversely, effects are limited to a slight change of the electrical conductivity in the case where the A ions are mixed into the M sites.

However, it is favorable that the electrode layer 11 is formed from a material that does not easily oxidize (e.g., an electrically conductive nitride, an electrically conductive oxide, etc.) because an oxidizing agent is created at the electrode layer (anode) 11 side after the set operation.

Also, it is good that the electrode layer 11 is formed from a material that does not conduct ions.

Such materials include, for example, those listed below; and thereamong, it can be said that $LaNiO_3$ is the most desirable material in regard to the overall performance considering the goodness of the electrical conductivity and the like.

MN

M is at least one type of element selected from the group consisting of Ti, Zr, Hf, V, Nb, and Ta. N is nitrogen.

$MO_x$

M is at least one type of element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt. The molar ratio x satisfies $1 \leq x \leq 4$.

$AMO_3$

A is at least one type of element selected from the group consisting of La, K, Ca, Sr, Ba, and Ln (lanthanoid).

M is at least one type of element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

$A_2MO_4$

A is at least one type of element selected from the group consisting of K, Ca, Sr, Ba, and Ln (lanthanoid).

M is at least one type of element selected from the group consisting of Ti, V, Cr, Mn, Fe, Co, Ni, Cu, Zr, Nb, Mo, Ru, Rh, Pd, Ag, Hf, Ta, W, Re, Ir, Os, and Pt.

O is oxygen.

Because a reducing agent is created at a protective layer (cathode) 13 side after the set operation, it is desirable that the protective layer 13 has a function of preventing the recording layer 12 from reacting with ambient air.

Such materials include, for example, amorphous carbon, diamond-like carbon, and semiconductors such as $SnO_2$.

The electrode layer 13A may function as a protective layer to protect the recording layer 12, and a protective layer may be provided instead of the electrode layer 13A. In such a case, the protective layer may be an insulator or a conductor.

To efficiently perform heating of the recording layer 12 during the reset operation, a heater layer (a material having a resistivity of about $10^{-5}$ Ωcm or more) may be provided on the cathode side, which is here, the electrode layer 13A side.

Further, it is desirable that the direction of the ion movement paths of the material of the recording layer 12 can be aligned perpendicular to the film surface. To this end, it is necessary to be oriented along an axis perpendicular to the c axis of the ilmenite structure of the recording layer 12.

Therefore, in the invention, the buffer layer 10 is added to the electrode layer 11 to control the orientation.

The buffer layer (foundation layer) 10 includes a compound including at least one selected from the group consisting of $M_3N_4$, $M_3N_5$, $MN_2$, $M_4O_7$, $MO_2$, and $M_2O_5$, where M is an element including at least one selected from the group consisting of Si, Ge, Sn, Zr, Hf, Nb, Ta, Mo, W, Ce, and Tb, N is nitrogen, and O is oxygen.

Figure 27A:
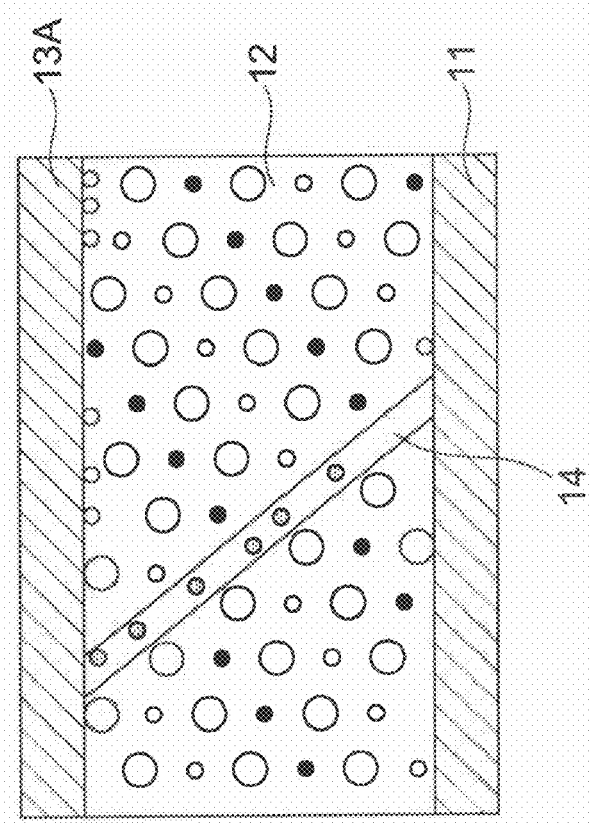
FIGS. 27A and 27B are conceptual views showing the structure of the recording unit of the first embodiment in which the crystal is divided in the film thickness direction.
Figure 27B:
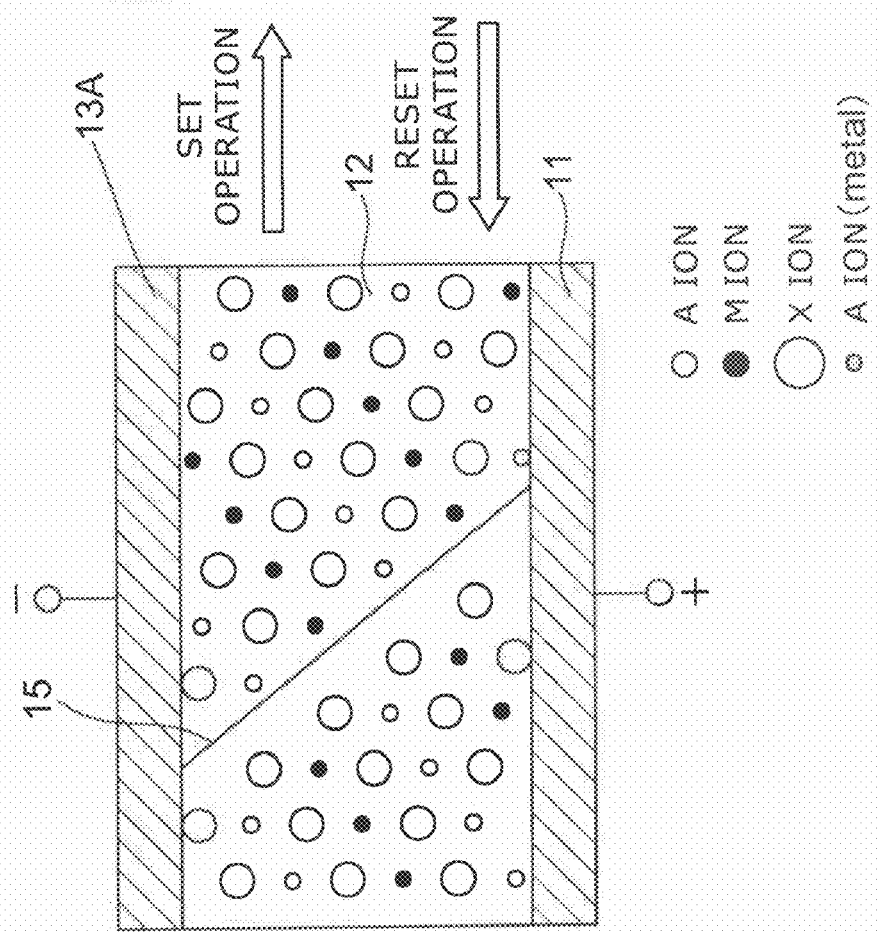

However, although the case is described where a sufficiently large crystal is obtained for the recording unit illustrated in FIG. 1, even in the case where the crystal is divided in the film thickness direction as illustrated in FIG. 27, it is possible to produce the movement of the A ions and the accompanying resistance change by the basic principle described in this embodiment.

That is, in the case where a negative voltage is applied to the electrode layer 13 in the state where the electrode layer 11 is grounded, the potential gradient occurs in the recording layer 12 and the A ions are transported. When the A ions move to the crystal interface, the A ions receive electrons gradually from the regions proximal to the electrode layer 13A and behave metallically. As a result, the metal layer 14 is formed proximally to the crystal interface.

Because the valence of the M ions increases in the interior of the recording layer 12, the conductivity thereof increases. In such a case, conduction paths of the metal layer 14 are formed along the crystal interface; and therefore, the resistance between the electrode layer 11 and the electrode layer 13A decreases, and as a recording device, a low resistance state is reached.

In such a case as well, it is possible to return to the high resistance state by pulling the A ions of the crystal interface back into the original crystalline structure by Joule heating due to a large current pulse, applying a voltage pulse in a reversed orientation, and the like.

However, to efficiently perform the movement of the A ions, it is favorable that the direction in which the A ions diffuse matches the direction in which the electric field is applied similarly to the recording unit illustrated in FIG. 1.

As described above, according to this embodiment, by using the materials described above as the recording layer 12, the diffusion of the cations can easily occur, the power consumption necessary for the resistance change can be reduced, and the thermal stability can be increased.

Next, the basic principle of recording/erasing/reproducing information in an information recording and reproducing apparatus according to a second embodiment of this embodiment will be described.

FIG. 2 is a conceptual view illustrating the structure of the recording unit of this embodiment.

The recording unit of this embodiment also has a structure in which the electrode layers 11 and 13A are disposed on either side of the recording layer 12 made of an ilmenite structure material. Further, the recording unit has a structure in which the buffer layer 10 is added to the electrode layer 11. Here as well, the electrode layer 13A may perform the role of a protective layer.

The recording layer 12 includes a first layer 12A and a second layer 12B. The first layer 12A is disposed on the electrode layer 13A side and includes a first compound represented by chemical formula 1: $A_xM_yX_3$ ($0.1 \leq x \leq 1.1$ and $0.75 \leq y \leq 1$). The second layer 12B is disposed on the electrode layer 11 side and includes a second compound having vacant sites. The vacant sites function to contain ions discharged from the first compound, make the movement of the ions smoother, and realize an improvement of the reversibility. The second compound 12B includes substances represented by the following chemical formulas, where vacant sites containing X or A are represented by □.

$MZ_2$

M is at least one type of element selected from the group consisting of Ti, V, Cr, Mn, Fe, Co, Ni, Nb, Ta, Mo, W, Re, Ru, and Rh.

Z is at least one type of element selected from the group consisting of O, S, Se, N, Cl, Br, and I. The molar ratio x satisfies $0.3 \leq x \leq 1$.

$MZ_3$

M is at least one type of element selected from the group consisting of Ti, V, Cr, Mn, Fe, Co, Ni, Nb, Ta, Mo, W, Re, Ru, and Rh.

Z is at least one type of element selected from the group consisting of O, S, Se, N, Cl, Br, and I. The molar ratio x satisfies $1 \leq x \leq 2$.

$MZ_4$

M is at least one type of element selected from the group consisting of Ti, V, Cr, Mn, Fe, Co, Ni, Nb, Ta, Mo, W, Re, Ru, and Rh.

Z is at least one type of element selected from the group consisting of O, S, Se, N, Cl, Br, and I. The molar ratio x satisfies $1 \leq x \leq 2$.

$MPO_z$

M is at least one type of element selected from the group consisting of Ti, V, Cr, Mn, Fe, Co, Ni, Nb, Ta, Mo, W, Re, Ru, and Rh.

P is the element phosphorus and O is the element oxygen. The molar ratio x satisfies $0.3 \leq x \leq 3$ and $4 \leq z \leq 6$.

It is favorable that the second compound has a structure including at least one selected from the group consisting of hollandite structure, ramsdellite structure, anatase structure, brookite structure, pyrolusite structure, $ReO_3$ structure, $MoO_{1.5}PO_4$ structure, $TiO_{0.5}PO_4$ structure and $FePO_4$ structure, $\beta MnO_2$ structure, $\gamma MnO_2$ structure, $\lambda MnO_2$ structure, spinel structure, and ilmenite structure. In particular, it is most desirable to have the same ilmenite structure as that of the first compound.

The Fermi level of the electrons of the first layer 12A is made lower than the Fermi level of the electrons of the second layer 12B. This is one condition desirable to provide the recording layer 12 with reversible states. All of the Fermi levels herein are taken as values measured from the vacuum level.

By using combinations of such materials in the recording layer and enabling the easy transfer of ions between the first layer 12A and the second layer 12B, the power consumption necessary for the resistance change can be reduced and the thermal stability can be increased.

In the first layer 12A, the large white circles represent the X ions; the small white circles with thick lines represent the M ions; and the small white circles represent the A ions. The small black circles in the second layer 12B represent the M ions.

As illustrated in FIG. 3, the first and second layers 12A and 12B forming the recording layer 12 may be alternately stacked in multiple layers of two or more layers, respectively.

In such a recording unit, in the case where a potential is applied to the electrode layers 11 and 13A such that the first layer 12A becomes the cathode side and the second layer 12B becomes the anode side and a potential gradient is produced in the recording layer 12, some of the X ions in the first layer 12A including the first compound move in the crystal and enter into the second layer 12B on the anode side. Or, in the case where a potential is applied to the electrode layers 11 and 13A such that the first layer 12A becomes the anode side and the second layer 12B becomes the cathode side and a potential gradient is produced in the recording layer 12, some of the A ions in the first layer 12A including the first compound move in the crystal and enter into the second layer 12B of the cathode side.

Because vacant sites of the X ions or the A ions exist in the crystal of the second layer 12B, the X ions or the A ions moving from the first layer 12A including the first compound are contained in the vacant sites.

Accordingly, in the second layer 12B, the valence of the X ions, the A ions, or some of the M ions decreases; and in the first layer 12A, the valence of the X ions, the A ions, or the M ions increases. Accordingly, it is necessary that at least one selected from the A ion and the M ion is a transition element having a d orbit incompletely filled by electrons such that the valence thereof can be easily changed.

That is, assuming that the first and second layers 12A and 12B are in a high resistance state (insulator) in the initial state (the reset state), some of the A ions in the first layer 12A moving into the second layer 12B produce conduction carriers in the crystal of the first and second layers 12A and 12B, and both become electrically conductive. Or, assuming that the first and second layers 12A and 12B are in a low resistance state in the initial state (the reset state), some of the X ions in the second layer 12A moving into the second layer 12B cause conduction carriers to be cancelled-out in the crystal of the first and second layers 12A and 12B, and both become insulators.

Thus, the electrical resistance value of the recording layer 12 is reduced or increased by applying a current/voltage pulse to the recording layer 12, and therefore the set operation (the recording) is realized.

At this time, although electrons also move simultaneously from the first layer 12A toward the second layer 12B, the Fermi level of the electrons of the first layer 12A is lower than the Fermi level of the electrons of the second layer 12B; and therefore, the total energy of the recording layer 12 increases.

Because such a high energy state continues even after the set operation is completed, there is a possibility that the recording layer 12 may undesirably naturally return from the set state (the low resistance state) to the reset state (high resistance state). Or, there is a possibility of undesirably returning from the set state (the high resistance state) to the reset state (low resistance state).

However, if the recording layer 12 according to the example of this embodiment is used, such a risk is avoided. In other words, the set state can be continuously maintained.

It is sufficient to appropriately select the ion radius and the ion valence. For example, in the case where bivalent cations with small ion radii are selected as the A ions, although the A ions easily diffuse in the ilmenite structure in which the diffusion paths of the A ions are formed in straight-line configurations when an external voltage is applied, a Coulomb repulsion force acts and diffusion of the A ions can be limited when an external voltage is not applied.

In the case where diffusion of the A ions and the M ions undesirably occurs in the first compound, the total energy required for switching undesirably increases due to the energy required therefor. To avoid this, it is desirable that both the A ions and the M ions are ions that do not diffuse. Diffusion of the A ions and the M ions can be prevented by making the valence of the A ions trivalent. Alternatively, even in the case where the valence of the A ions is low, diffusion of the A ions and the M ions can be prevented by using an ion with a large ion radius.

However, because an oxidizing agent is created on the anode side after the set operation is completed, in such a case as well, it is desirable to use a material as the electrode layer 11 that does not easily oxidize and does not conduct ions (e.g., an electrically conductive oxide). Favorable examples are described above.

To perform the reset operation (the erasing), it is sufficient to heat the recording layer 12 and facilitate the phenomenon of the X ions or the A ions stored in the vacant sites of the first layer 12B described above going back into the first layer 12A.

Specifically, the recording layer 12 can be easily returned to the original high resistance state (insulator) or low resistance state by utilizing the Joule heat produced by applying a large current pulse to the recording layer 12 and the residual heat thereof.

Thus, the reset operation (the erasing) is realized because the electrical resistance value of the recording layer 12 is increased or reduced by applying the large current pulse to the recording layer 12. Alternatively, the reset operation is possible also by applying an electric field having an orientation reversed from that during the setting.

As described above, it is desirable that the recording layer 12 including the ilmenite structure material has a structure in which the c axis of the crystal is oriented in the horizontal direction with respect to the film surface or within 45 degrees from the horizontal direction.

Examples of information recording and reproducing apparatuses will now be described.

The three cases of the recording unit of the first and the second embodiments being applied to a probe memory, a semiconductor memory, and a flash memory will now be described.

(Probe Memory)

Figure 5:
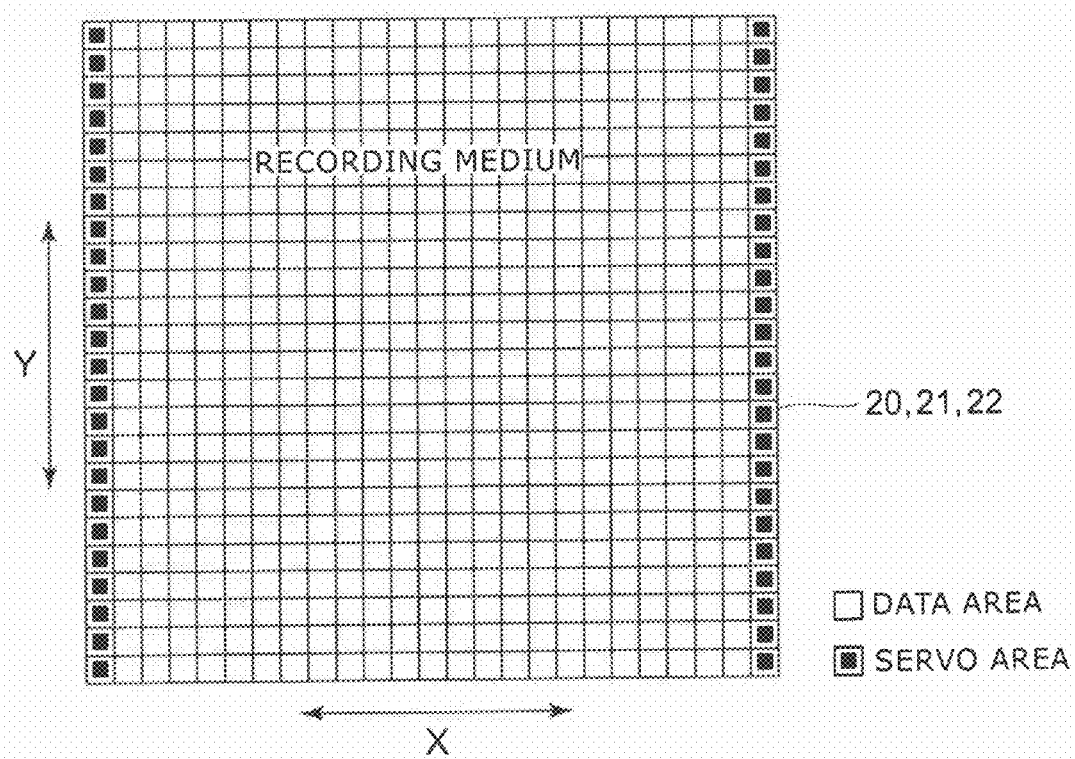
FIG. 5 is a schematic view illustrating a probe memory according to the invention.

FIG. 4 and FIG. 5 are schematic views illustrating a probe memory according to this embodiment.

A recording medium in which recording units of either the first or second embodiment are provided is disposed on an XY scanner 16. A probe array is disposed to oppose the recording medium.

The probe array includes a substrate 23 and multiple probes (heads) 24 disposed in an array configuration on one face side of the substrate 23. Each of the multiple probes 24, for example, is formed from a cantilever and driven by multiplex drivers 25 and 26.

Although it is possible to individually operate each of the multiple probes 24 using microactuators in the substrate 23, herein, an example is described where access of the data area of the recording medium is performed by collectively performing the same operation on all of the probes 24.

First, all of the probes 24 are operated back and forth in an X direction at a constant period using the multiplex drivers 25 and 26, and positional information of a Y direction is read from a servo area of the recording medium. The positional information of the Y direction is transferred to a driver 15.

The driver 15 drives the XY scanner 16 based on the positional information, moves the recording medium in the Y direction, and performs positional alignment between the recording medium and the probes.

When the positional alignment thereof is completed, data is read or written simultaneously and continuously for all of the probes 24 on the data area.

Data can be read and written continuously because the probes 24 operate back and forth in the X direction. The reading and writing of the data is implemented one row at a time for the data area by progressively changing the position of the recording medium in the Y direction.

The recording medium may be moved back and forth in the X direction at a constant period, positional information may be read from the recording medium, and the probes 24 may be moved in the Y direction.

The recording medium, for example, is formed from a substrate 20, an electrode layer 21 on the substrate 20, and a recording layer 22 on the electrode layer 21.

The recording layer 22 includes multiple data areas and servo areas disposed at both ends of the multiple data areas in the X direction. The multiple data areas make up the main components of the recording layer 22.

Servo burst signals are recorded in the servo areas. The servo burst signals indicate the positional information of the data areas in the Y direction.

Further, in addition to such information, an address area in which address data is recorded and a preamble area for synchronization are disposed in the recording layer 22.

The data and the servo burst signal are recorded in the recording layer 22 as recorded bits (electrical resistance fluctuation). "1" and "0" information of each recorded bit is read by detecting the electrical resistance of the recording layer 22.

In this example, one probe (head) is provided corresponding to one data area, and one probe is provided for one servo area.

The data area is formed from multiple tracks. The track of the data area is designated by an address signal read from the address area. The servo burst signal read from the servo area eliminates reading errors of the recorded bits by moving the probes 24 to the center of the track.

Here, it is possible to utilize head position control technology of HDDs by having the X direction correspond to the down-track direction and the Y direction correspond to the track direction.

Next, the recording/reproducing operation of a probe memory will be described.

Figure 6:
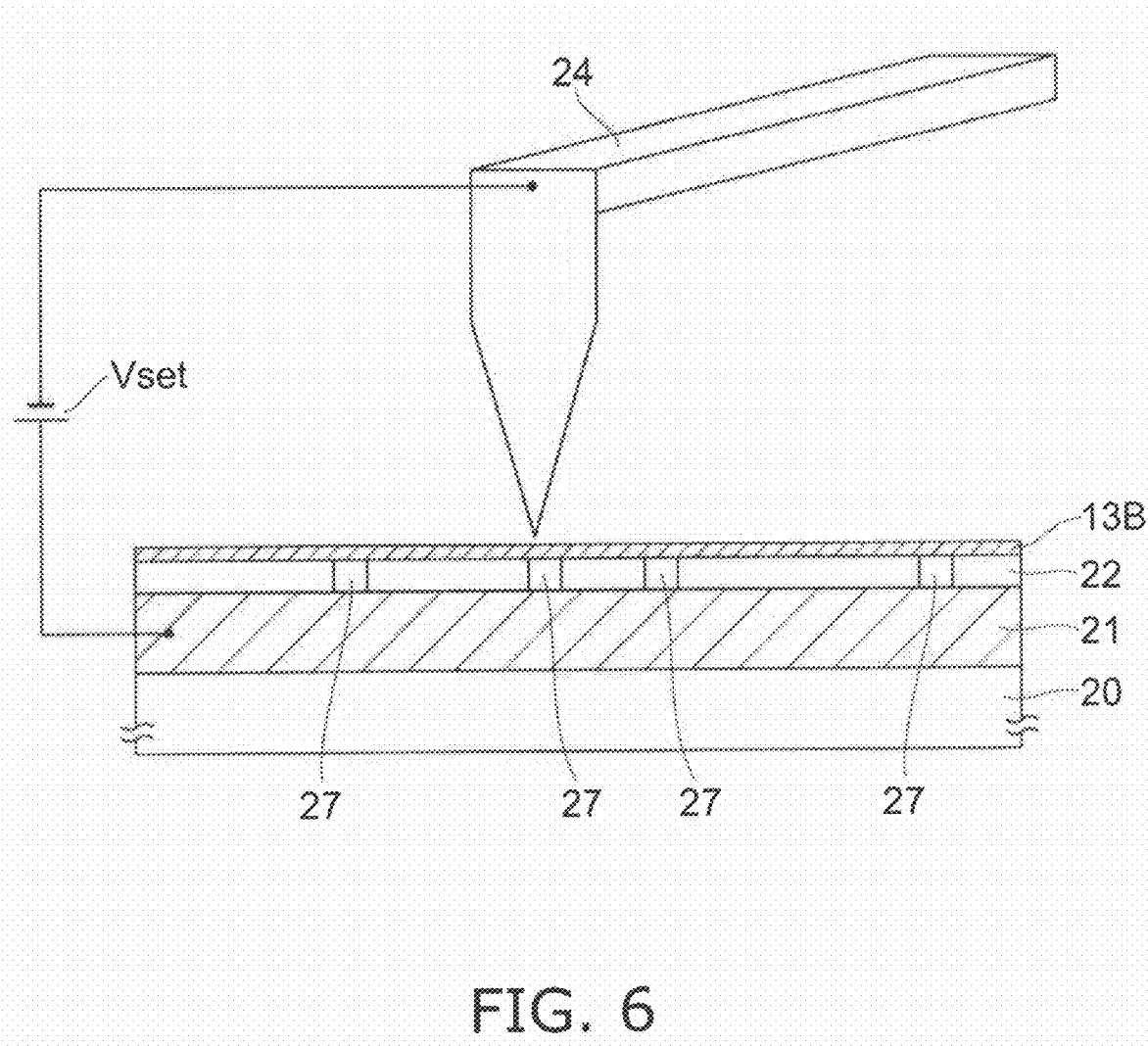
FIG. 6 is a conceptual view for describing the state during a recording (set operation).

FIG. 6 is a conceptual view for describing the state during a recording (set operation).

The recording medium is formed from the electrode layer on the substrate (e.g., a semiconductor chip) 20, the recording layer 22 on the electrode layer 21, and a protective layer 13B on the recording layer 22. The protective layer 13B is formed, for example, from a thin insulator.

The recording operation is performed by applying a voltage to the surface of a recorded bit 27 of the recording layer 22 and producing a potential gradient in the interior of the recorded bit 27. Specifically, it is sufficient to provide a current/voltage pulse to the recorded bit 27.

(The Case Where the Recording Unit of the First Embodiment is Used)

The case where the recording unit of the first embodiment described above in regard to FIG. 1 is used will now be described.

Figure 7:
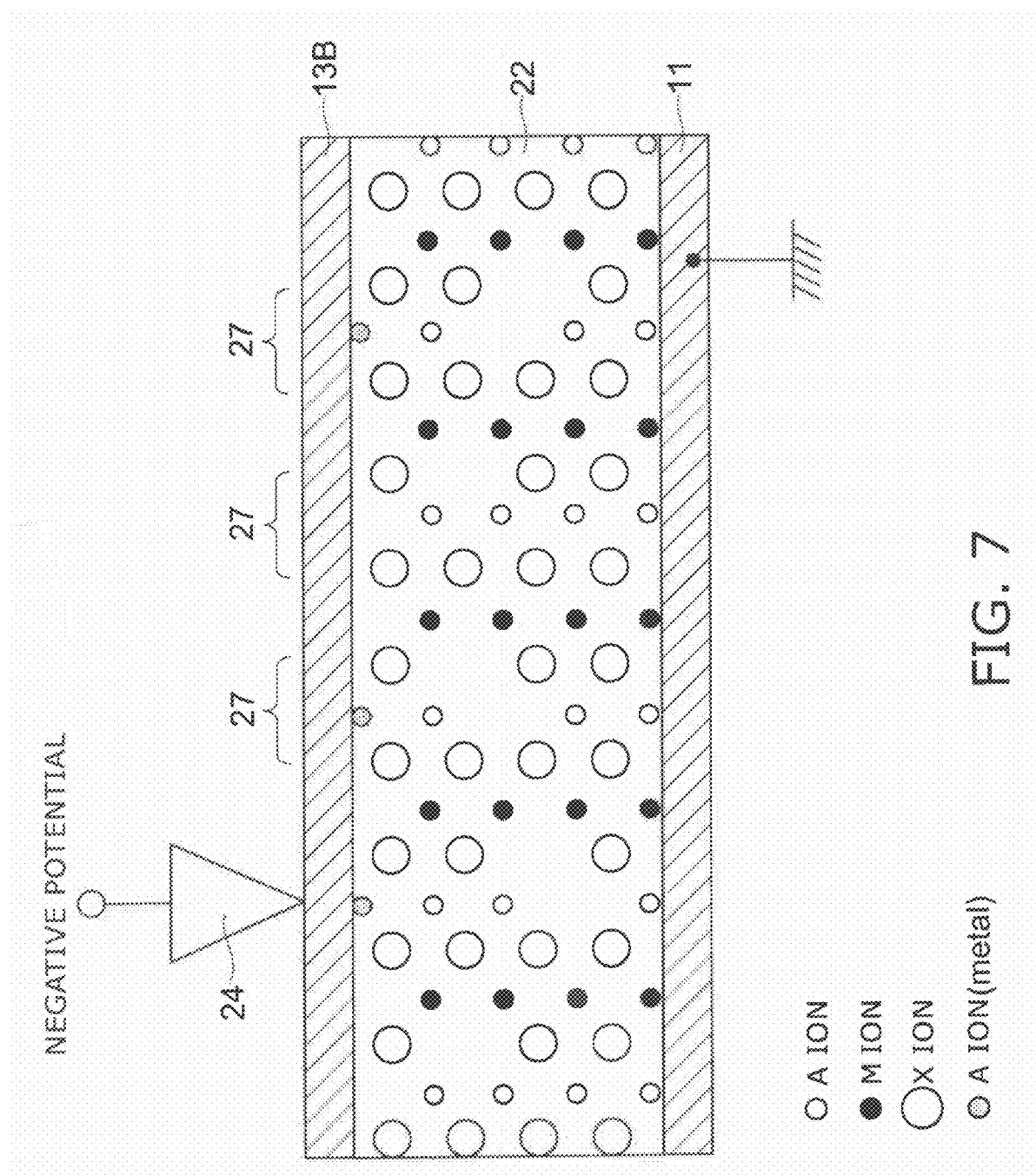
FIG. 7 is a schematic view illustrating a recording.

FIG. 7 is a schematic view illustrating a recording.

First, as illustrated in FIG. 7, a state is made in which the potential of the probes 24 is relatively lower than the potential of the electrode layer 21. In the case where the electrode layer 21 is a fixed potential (e.g., the grounding potential), it is sufficient to apply a negative potential to the probe 24.

The current pulse is produced by, for example, using an electron source or a hot electron source and emitting electrons from the probe 24 toward the electrode layer 21. Alternatively, the voltage pulse may be applied by bringing the probe 24 into contact with the surface of the recorded bit 27.

At this time, for example, at the recorded bit 27 of the recording layer 22, some of the A ions move to the probe (the cathode) 24 side, and the A ions in the crystal decrease relatively with respect to the X ions. The A ions moving to the probe 24 side also receive electrons from the probe 24 and precipitate as a metal.

At the recorded bit 27, the X ions become excessive; and as a result, the valence of the A ions or the M ions in the recorded bit 27 increases. That is, because the recorded bit 27 conducts electrons due to the implantation of carriers by a phase change, the resistance in the film thickness direction decreases and the recording (the set operation) is completed.

The current pulse for recording also may be produced by making a state in which the potential of the probe 24 is relatively higher than the potential of the electrode layer 21.

Figure 8:
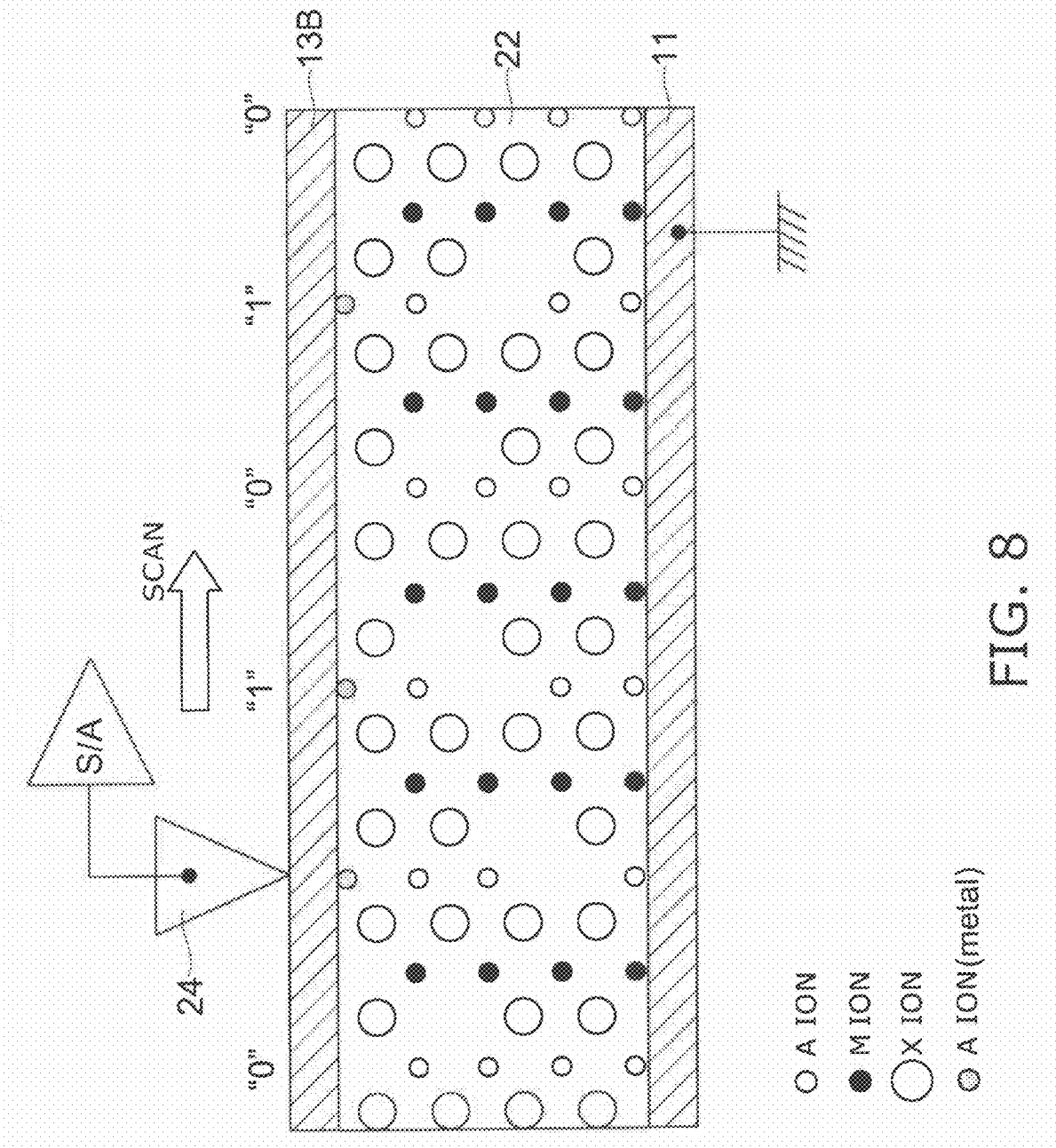
FIG. 8 is a schematic view illustrating reproduction.

FIG. 8 is a schematic view illustrating reproduction.

Reproduction is performed by providing a current pulse to the recorded bit 27 of the recording layer 22 and detecting the resistance value of the recorded bit 27. However, the current pulse is given a value small enough not to cause a resistance change in the material forming the recorded bit 27 of the recording layer 22.

For example, the reading current (the current pulse) produced by a sense amplifier S/A is provided by the probe 24 to the recorded bit 27, and the resistance value of the recorded bit 27 is measured by the sense amplifier S/A.

By using the materials according to the first embodiment, a difference of the resistance values of the set/reset states of $10^3$ or more can be ensured.

The reproduction may be continuously performed by scanning with the probe 24 over the recording medium.

The erasing (the reset) operation may be performed by Joule heating the recorded bit 27 of the recording layer 22 by a large current pulse and facilitating the oxidation-reduction reaction of the recorded bit 27. Alternatively, a pulse providing a potential difference with an orientation reversed from that during the set operation may be applied.

The erasing operation can be performed for each of the recorded bits 27 or can be performed for multiple recorded bits 27 or by blocks.

(The Case Where the Recording Unit of the Second Embodiment is Used)

Next, the case where the recording unit of the second embodiment described above in regard to FIG. 2 is used will be described.

Figure 9:
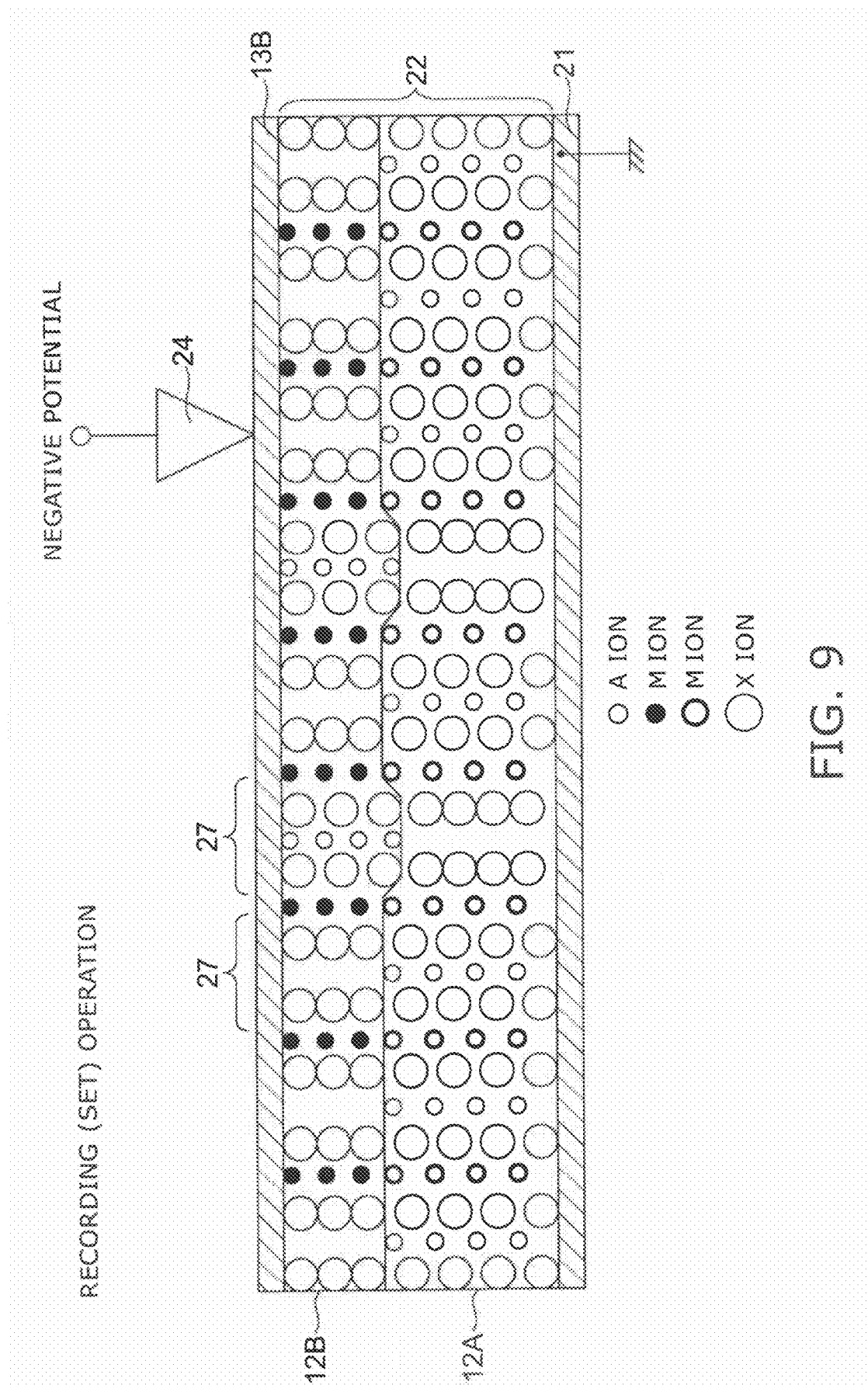
FIG. 9 is a schematic view illustrating a recording state.

FIG. 9 is a schematic view illustrating a recording state.

First, as illustrated in FIG. 9, the state is made in which the potential of the probe 24 is relatively lower than the potential of the electrode layer 21. Or, a state is made in which the potential of the probe 24 is relatively higher than the potential of the electrode layer 21. In the case where the electrode layer 21 is a fixed potential (e.g., the grounding potential), it is sufficient to apply a negative potential or a positive potential to the probe 24.

At this time, some of the X ions or the A ions in the first layer 12A of the recording layer 22 move in the crystal and are contained in vacant sites of the second compound 12B. It follows that the valence of the X ions, the A ions, or the M ions in the first layer 12A increases and the valence of the X ions, the A ions, or the M1 ions in the second compound 12B decreases. As a result, assuming that the first and second layers 12A and 12B are in the high resistance state (insulator) in the initial state (the reset state), some of the A ions in the first layer 12A move in the second layer 12B, and thereby conduction carriers are produced in the crystals of the first and second layers 12A and 12C; and both become electrically conductive. Or, assuming that the first and second layers 12A and 12B are in the low resistance state in the initial state (the reset state), some of the X ions in the second layer 12A move in the second layer 12B, and thereby conduction carriers are cancelled-out in the crystals of the first and second layers 12A and 12B; and both become insulators.

Thereby, the set operation (the recording) is completed.

Regarding the recording operation, by reversing the positional relationship of the first and second layers 12A and 12B, a state can be made in which the potential of the probe 24 is relatively lower than the potential of the electrode layer 21 to execute the set operation.

Figure 10:
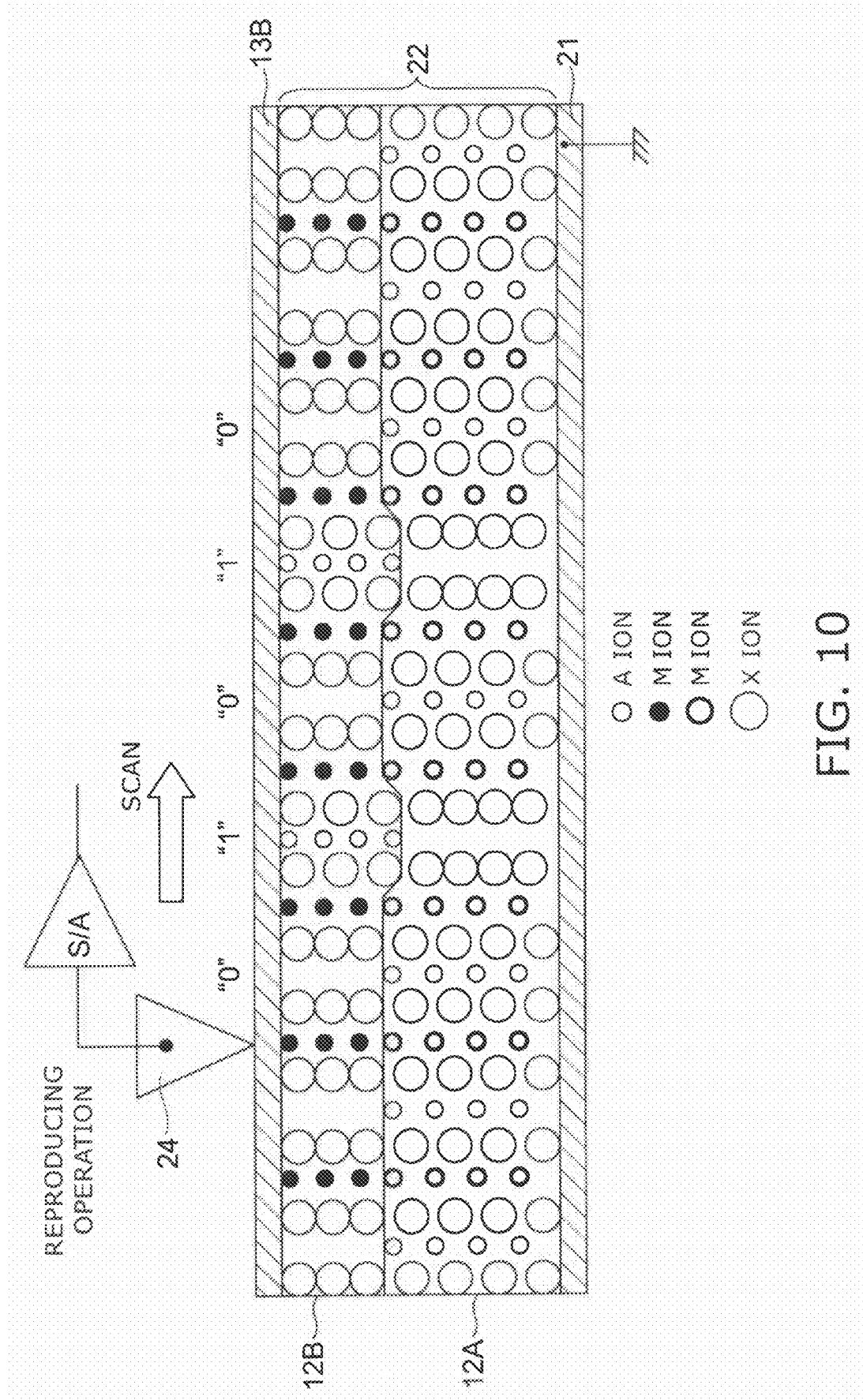
FIG. 10 is a schematic view illustrating the state during reproduction.

FIG. 10 is a schematic view illustrating the state during reproduction.

The reproducing operation is performed by providing a current pulse to the recorded bit 27 and detecting the resistance value of the recorded bit 27. However, the current pulse is given a value small enough not to cause a resistance change in the material forming the recorded bit 27.

For example, the read current (the current pulse) produced by the sense amplifier S/A is provided by the probe 24 to the recording layer (the recorded bit) 22, and the resistance value of the recorded bit is measured by the sense amplifier S/A. By using the new materials described above, a difference of the resistance values of the set/reset states of $10^3$ or more can be ensured.

The reproducing operation can be performed continuously by scanning with the probe 24.

In the reset (the erasing) operation, it is sufficient to utilize the Joule heat produced by providing a large current pulse to the recording layer (the recorded bit) 22 and the residual heat thereof and facilitate the effect of the X or the A ions tending to go back into the first layer 12A from the vacant sites in the second layer 12B. Alternatively, a pulse providing a potential difference having an orientation reversed from that during the set operation may be applied.

The erasing operation can be performed for each recorded bit 27 or can be performed for multiple recorded bits 27 or by blocks.

Figure 28:
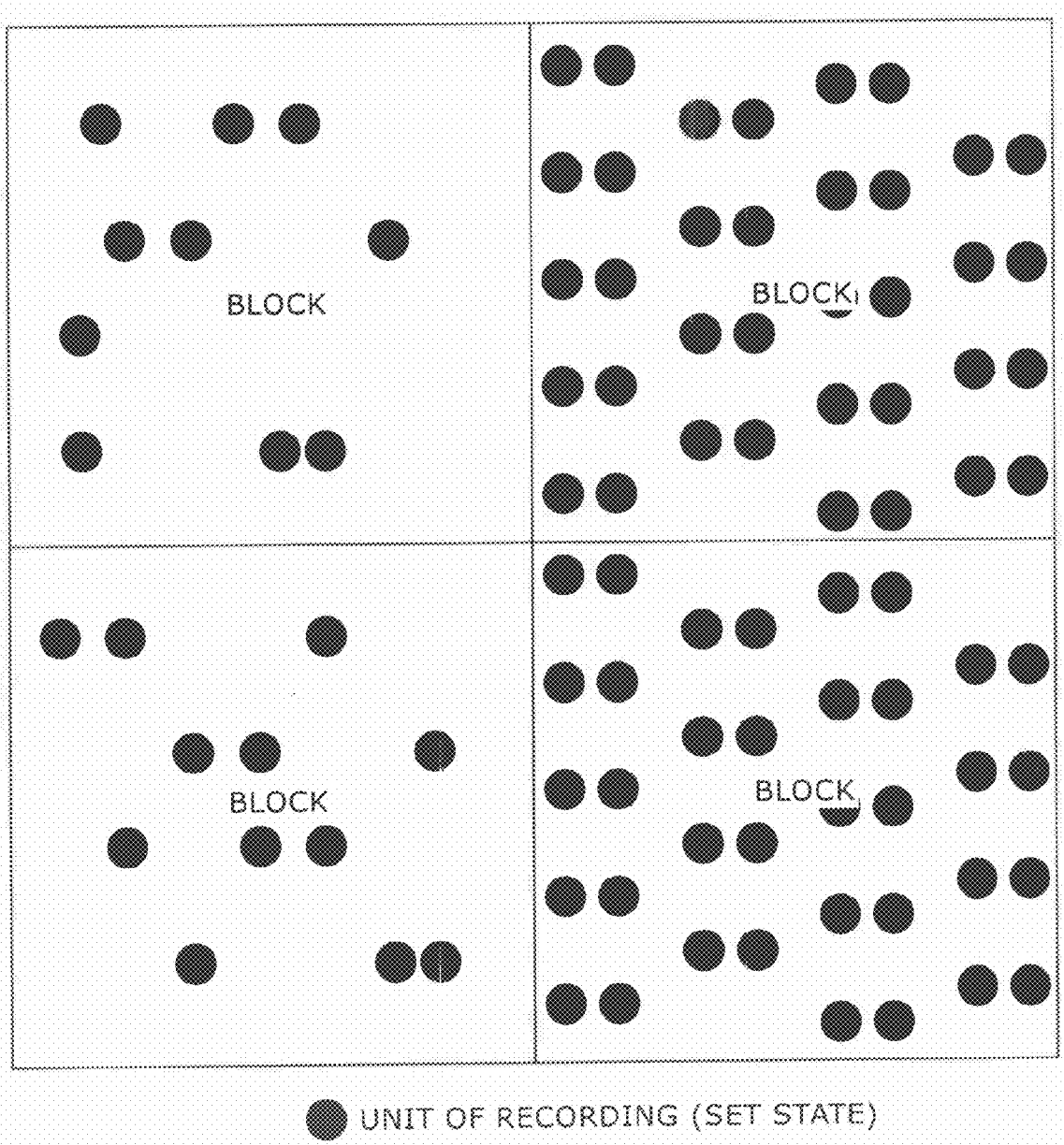
FIG. 28 is a schematic view illustrating blocks in the data region after the information recording is completed.

FIG. 28 is a schematic view illustrating blocks in the data region after the information recording is completed. The black circles represent units of recording where the information recording was performed. According to the probe memory according to this example, information recording on the recording medium by units of recording can be performed similarly to hard disk drives and a new recording material is used; and thereby, higher recording density and lower power consumption than conventional hard disk drives and flash memory can be realized.

(Semiconductor Memory)

Next, the information recording and reproducing apparatus in combination with a semiconductor device will be described.

Figure 11:
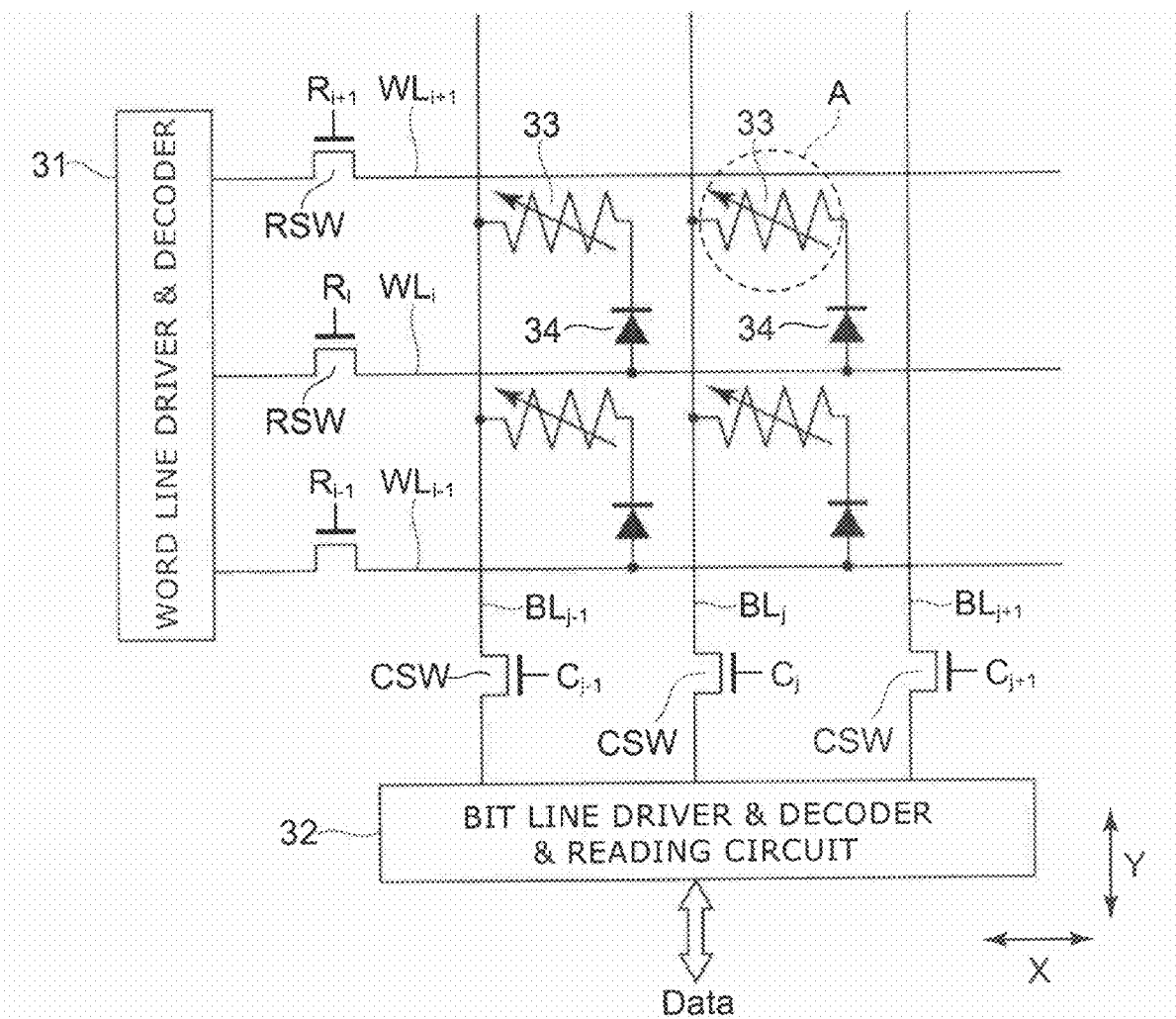
FIG. 11 is a schematic view illustrating a cross-point semiconductor memory including the recording layer from either the first or second embodiment.

FIG. 11 is a schematic view illustrating a cross-point semiconductor memory including the recording layer from either the first or second embodiment.

Word lines WLi−1, WLi, and WLi+1 align in the X direction; and bit lines BLj−1, BLj, and BLj+1 align in the Y direction.

One end of the word lines WLi−1, WLi, and WLi+1 is connected to a word line driver & decoder 31 through a MOS transistor RSW as a selection switch; and one end of the bit lines BLj−1, BLj, and BLj+1 is connected to a bit line driver & decoder & reading circuit 32 through a MOS transistor CSW as a selection switch.

Selection signals Ri−1, Ri, and Ri+1 are input to the gate of the MOS transistor RSW to select one word line (row); and selection signals Ci−1, Ci, and Ci+1 are input to the gate of the MOS transistor CSW to select one bit line (column).

Memory cells 33 are disposed at the intersections between the word lines WLi−1, WLi, and WLi+1 and the bit lines BLj−1, BLj, and BLj+1. The structure is a so-called cross-point cell array structure.

Diodes 34 are added to the memory cells 33 to prevent sneak current during the recording/reproducing.

Figure 12:
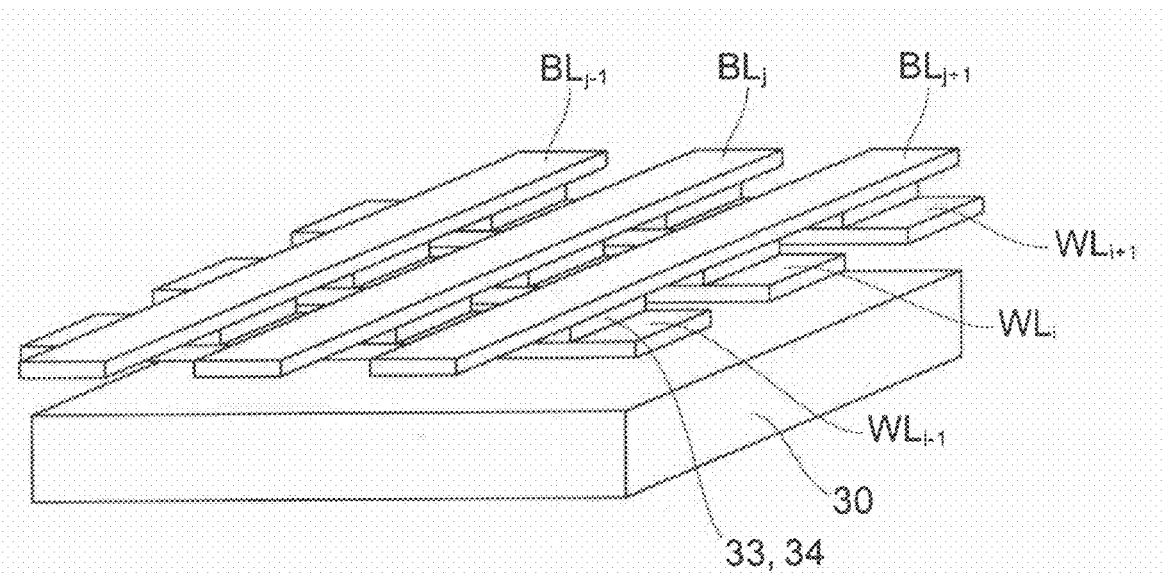
FIG. 12 is a schematic view illustrating the structure of the memory cell array unit of the semiconductor memory of FIG. 11.

FIG. 12 is a schematic view illustrating the structure of the memory cell array unit of the semiconductor memory of FIG. 11.

The word lines WLi−1, WLi, and WLi+1 and the bit lines BLj−1, BLj, and BLj+1 are disposed on a semiconductor chip 30; and the memory cells 33 and the diodes 34 are disposed at the intersections of these interconnects.

The merit of such a cross-point cell array structure is in the advantageous point of high integration because it is not necessary to connect MOS transistors individually to the memory cells 33. For example, as illustrated in FIG. 14 and FIG. 15, it is also possible to stack the memory cells 33 to form memory cell arrays in a three-dimensional structure.

Figure 13:
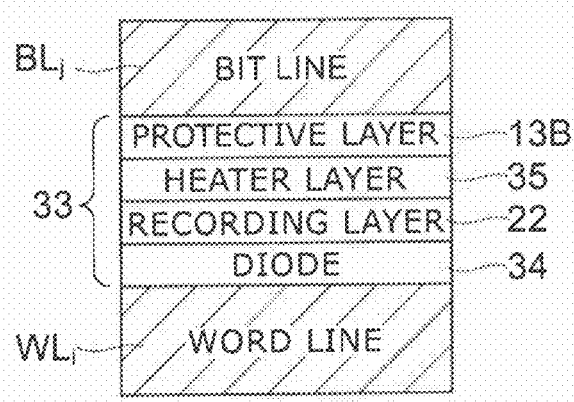
FIG. 13 is a schematic view illustrating the structure of the memory cell 33.

The memory cell 33 including the recording layer of either the first or second embodiment is formed from, for example, a stacked structure of the recording layer 22, the protective layer 13B, and a heater layer 35 as illustrated in FIG. 13. One memory cell 33 stores one bit of data. The diode 34 is disposed between the word line WLi and the memory cell 33.

Figure 14:
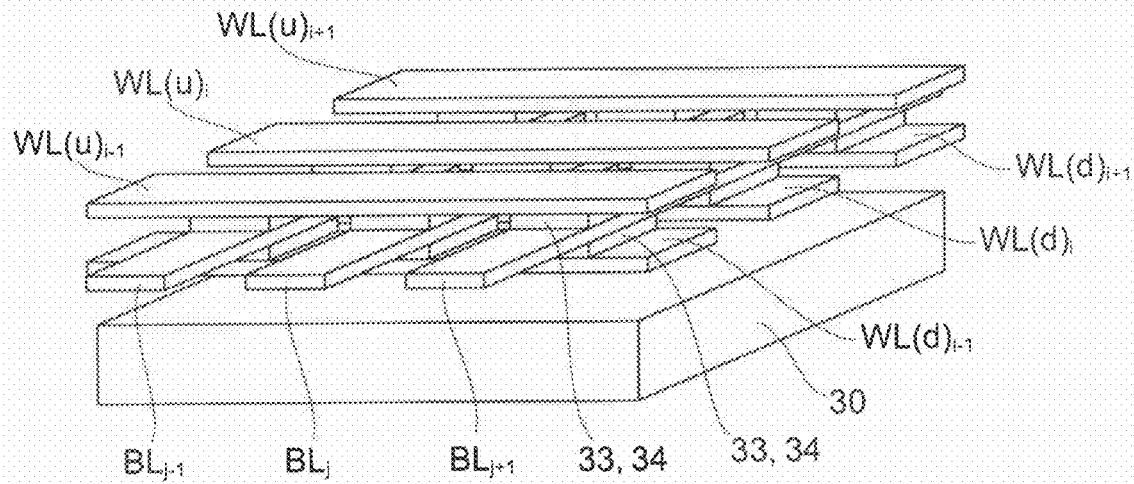
FIG. 14 is a schematic view illustrating another specific example of memory cell arrays.
Figure 15:
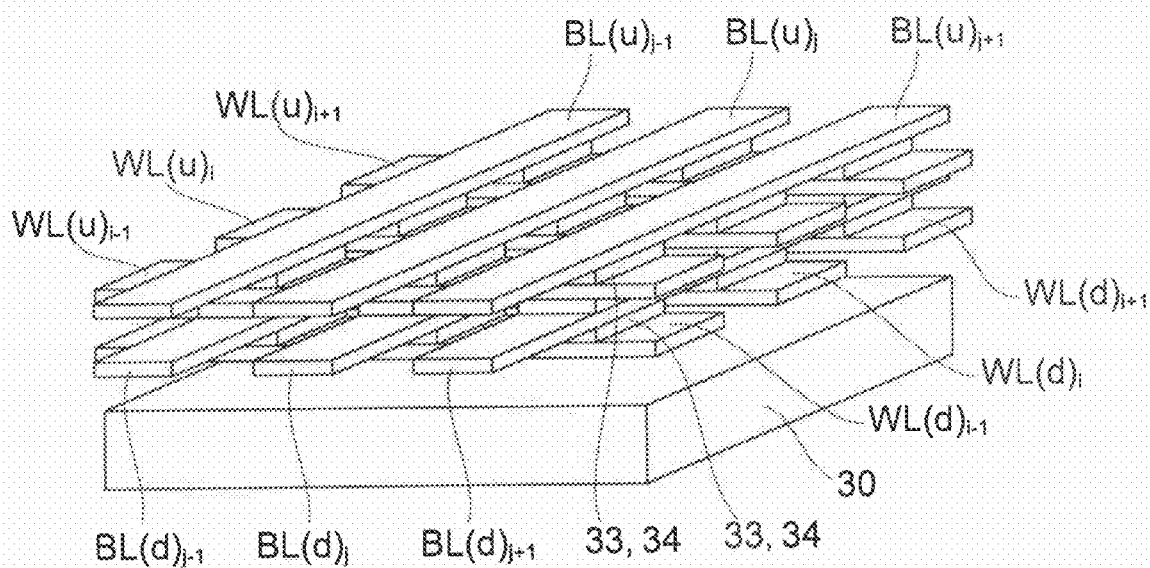
FIG. 15 is a schematic view illustrating another specific example of memory cell arrays.

FIG. 14 and FIG. 15 are schematic views illustrating other specific examples of memory cell arrays.

In the specific example illustrated in FIG. 14, the word lines WLi−1, WLi, and WLi+1 aligned in the X direction are provided above and below the bit lines BLj−1, BLj, and BLj+1 aligned in the Y direction, respectively. The memory cells 33 and 34 are disposed at each of the cross points of the bit lines and the word lines. That is, the structure has bit lines shared by the memory cells thereabove and therebelow.

The specific example illustrated in FIG. 15 has a structure in which the bit lines BLj−1, BLj, and BLj+1 aligned in the Y direction and the word lines WLi−1, WLi, and WLi+1 aligned in the X direction are alternately stacked. The memory cells 33 and 34 are disposed at each of the cross points of the bit lines and the word lines. That is, the structure has the bit lines and the word lines shared by the memory cells thereabove and therebelow.

By using stacked structures such as those illustrated in FIG. 14 and FIG. 15, it is possible to increase the recording density.

Next, the recording/reproducing operation of the semiconductor memory using the recording layers of the first and second embodiments will be described with reference to FIG. 11 to FIG. 13.

Here, the case will be described where the memory cell 33 enclosed by the dotted line A in FIG. 11 is selected and a recording/reproducing operation thereof is executed.

(The Case Where the Recording Layer of the First Embodiment is Used)

In the recording (the set operation), it is sufficient to apply a voltage to the selected memory cell 33, produce a potential gradient in the memory cell 33, and provide a current pulse; and therefore, a state is made, for example, in which the potential of the word line WLi is relatively lower than the potential of the bit line BLj. In the case where a fixed potential (e.g., the grounding potential) is applied to the bit line BLj, it is sufficient to apply a negative potential to the word line WLi.

At this time, in the selected memory cell 33 enclosed by the dotted line A, some of the A ions move to the word line (cathode) WLi side, and the A ions in the crystal decrease relatively with respect to the X ions. The A ions moving to the word line WLi side receive electrons from the word line WLi and precipitate as a metal.

In the selected memory cell 33 enclosed by the dotted line A, the X ions become excessive and as a result, the valence of the A ions or the M ions in the crystal increases. That is, the selected memory cell 33 enclosed by the dotted line A conducts electrons due to the implantation of carriers by the phase change; and therefore, the recording (the set operation) is completed.

During the recording, it is desirable to bias all of the unselected word lines WLi−1 and WLi+1 and the unselected bit lines BLj−1 and BLj+1 with the same potential.

During a standby prior to recording, it is desirable to precharge all of the word lines WLi−1, WLi, and WLi+1 and all of the bit lines BLj−1, BLj, and BLj+1.

The current pulse for the recording may be produced by making a state in which the potential of the word line WLi is relatively higher than the potential of the bit line BLj.

The reproduction is performed by providing the current pulse to the selected memory cell 33 enclosed by the dotted line A and detecting the resistance value of the memory cell 33. However, it is necessary that the current pulse is given a value small enough not to cause a resistance change of the material forming the memory cells 33.

For example, the reading current (the current pulse) produced by the reading circuit flows from the bit line BLj to the memory cell 33 enclosed by the dotted line A, and the resistance value of the memory cell 33 is measured by the reading circuit. By using the new materials described above, a difference of the resistance values of the set/reset states of $10^3$ or more can be ensured.

The erasing (the reset) operation is performed by Joule heating of the selected memory cell 33 enclosed by the dotted line A by a large current pulse and facilitating the oxidation-reduction reaction in the memory cell 33.

(The Case Where the Recording Layer of the Second Embodiment is Used)

In the recording operation (the set operation), it is sufficient to apply a voltage to the selected memory cell 33, produce a potential gradient in the memory cell 33, and provide a current pulse; and therefore, the potential of the word line WLi, for example, is made relatively lower or higher than the potential of the bit line BLj. In the case where a fixed potential (e.g., the grounding potential) is applied to the bit line BLj, it is sufficient to apply a negative potential or a positive potential to the word line WLi.

At this time, in the selected memory cell 33 enclosed by the dotted line A, some of the X ions or the A ions in the first compound move into the vacant sites of the second compound. Therefore, the valence of the X ions, the A ions, or the M ions in the second compound decreases and the valence of the X ions, the A ions, or the M ions in the first compound increases. As a result, assuming that the first and second layers 12A and 12B are in a high resistance state (insulator) in the initial state (the reset state), conduction carriers are produced in the crystals of the first and second layers 12A and 12C because some of the A ions in the first layer 12A move in the second layer 12B; and both become electrically conductive. Or, assuming that the first and second layers 12A and 12B are in a low resistance state in the initial state (the reset state), conduction carriers are cancelled-out in the crystals of the first and second layers 12A and 12B because some of the X ions in the second layer 12A move in the second layer 12B; and both become insulators.

Thereby, the set operation (the recording) is completed.

During the recording, it is desirable to bias all of the unselected word lines WLi−1 and WLi+1 and the unselected bit lines BLj−1 and BLj+1 to the same potential.

During the standby prior to the recording, it is desirable to pre-charge all of the word lines WLi−1, WLi, and WLi+1 and all of the bit lines BLj−1, BLj, and BLj+1.

The current pulse may be produced by making a state in which the potential of the word line WLi is relatively higher than the potential of the bit line BLj.

The reproducing operation is performed by providing a current pulse to the selected memory cell 33 enclosed by the dotted line A and detecting the resistance value of the memory cell 33. However, it is necessary that the current pulse has a value small enough not to cause a resistance change of the material forming the memory cell 33.

For example, the reading current (the current pulse) produced by the reading circuit flows from the bit line BLj to the memory cell 33 enclosed by the dotted line A, and the resistance value of the memory cell 33 is measured by the reading circuit. By using the new materials described above, a difference of the resistance values of the set/reset states of $10^3$ or more can be ensured.

In the reset (the erasing) operation, it is sufficient to utilize the Joule heat produced by providing the large current pulse to the selected memory cell 33 enclosed by the dotted line A and the residual heat thereof and facilitate the effect of the X ion or A ion elements tending to go back into the first compound from the vacant sites in the second compound.

As described above, according to the semiconductor memory of this embodiment, a higher recording density and lower power consumption than conventional hard disk drives and flash memory can be realized.

(Flash Memory)

It is possible to apply this embodiment also to flash memory.

FIG. 16 is a schematic cross-sectional view illustrating a memory cell of flash memory.

The memory cell of the flash memory is formed from a MIS (metal-insulator-semiconductor) transistor.

Diffusion layers 42 are formed in a surface region of a semiconductor substrate 41. A gate insulation layer 43 is formed on the channel region between the diffusion layers 42. A recording layer (RRAM: Resistive RAM) 44 including the recording layer of either the first or second embodiment is formed on the gate insulation layer 43. A control gate electrode 45 is formed on the recording layer 44.

The semiconductor substrate 41 may be a well region, and the semiconductor substrate 41 and the diffusion layer 42 may have mutually opposite conductivity types. The control gate electrode 45 forms a word line and may be formed from, for example, conductive polysilicon.

The recording layer 44 may be formed of the material forming the recording layer 12 described above in regard to the first and second embodiments.

The basic operation thereof will now be described with reference to FIG. 16.

The set (the writing) operation is executed by applying a potential V1 to the control gate electrode 45 and applying a potential V2 to the semiconductor substrate 41.

Although it is necessary that the difference between the potentials V1 and V2 is sufficiently great enough that the recording layer 44 undergoes a phase change or a resistance change, there are no particular limitations on the orientation thereof.

In other words, it is sufficient that either V1>V2 or V1<V2.

For example, assuming that the recording layer 44 is an insulator (large resistance) in the initial state (the reset state), the gate insulation layer 43 substantially has a greater thickness, and therefore the threshold of the memory cell (the MIS transistor) increases.

From such a state, by applying the potentials V1 and V2 and changing the recording layer 44 to a conductor (small resistance), the gate insulation layer 43 substantially has a smaller thickness, and therefore the threshold of the memory cell (the MIS transistor) decreases.

Although the potential V2 is applied to the semiconductor substrate 41, the potential V2 may be transferred from the diffusion layers 42 to the channel region of the memory cell instead.

The reset (the erasing) operation is executed by applying a potential V1' to the control gate electrode 45, applying a potential V3 to one of the diffusion layers 42, and applying the potential V4 (<V3) to the other diffusion layer 42.

The potential V1' is given a value greater than the threshold of the memory cell in the set state.

At this time, the memory cell is switched ON, electrons flow from the other diffusion layer 42 toward the one diffusion layer 42, and hot electrons are produced. Because the hot electrons are implanted into the recording layer 44 via the gate insulation layer 43, the temperature of the recording layer 44 increases.

Thereby, the recording layer 44 changes from a conductor (small resistance) to an insulator (large resistance); and therefore, the gate insulation layer 43 substantially has a greater thickness, and the threshold of the memory cell (the MIS transistor) increases.

Thus, because the threshold of the memory cell can be changed by a principle similar to flash memory, flash memory technology is utilized and the information recording and reproducing apparatus according to the example of this embodiment can be practically used.

(NAND Flash Memory)

Figure 17:
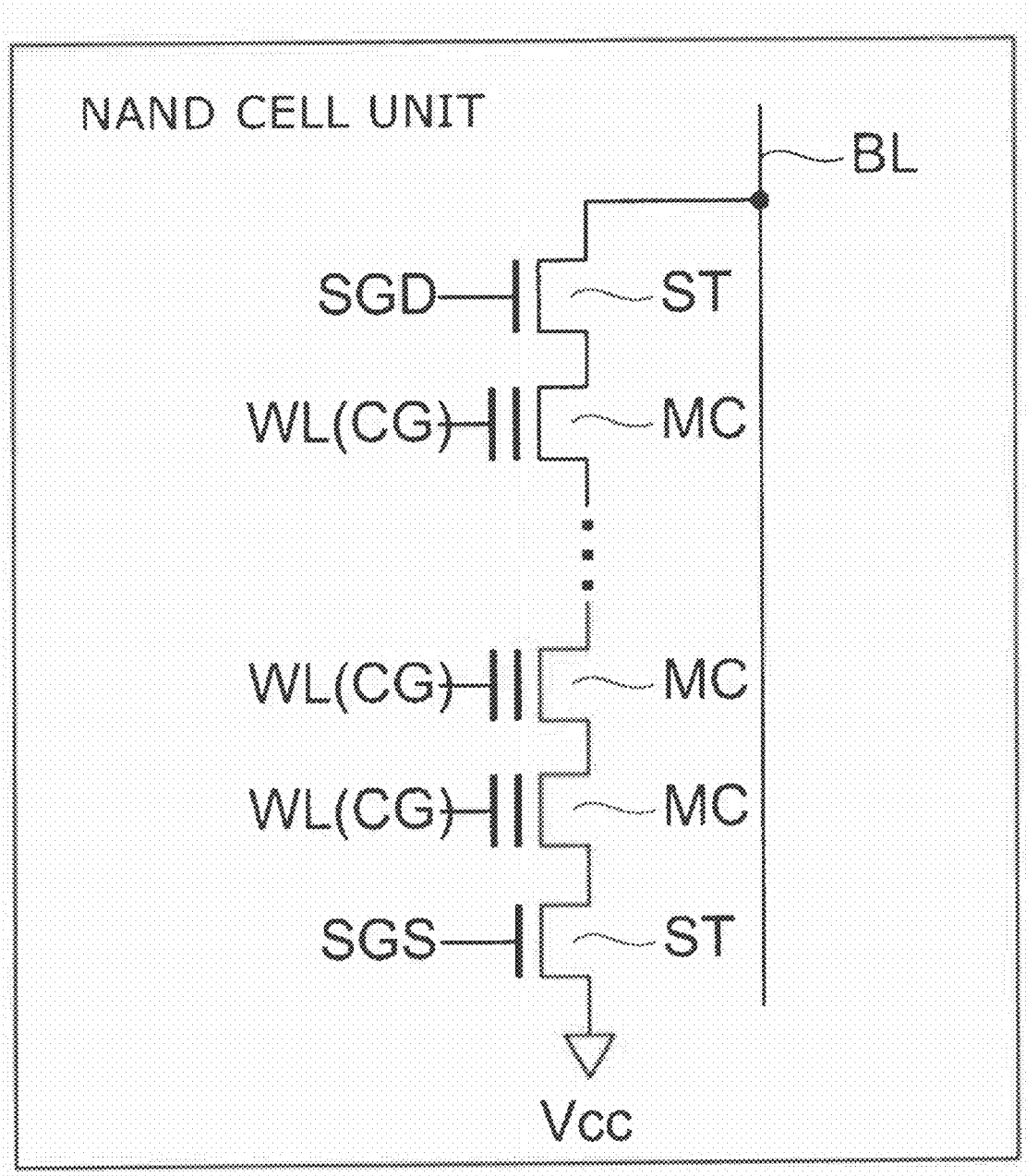
FIG. 17 is a circuit diagram of a NAND cell unit.

FIG. 17 is a circuit diagram of a NAND cell unit.

Figure 18:
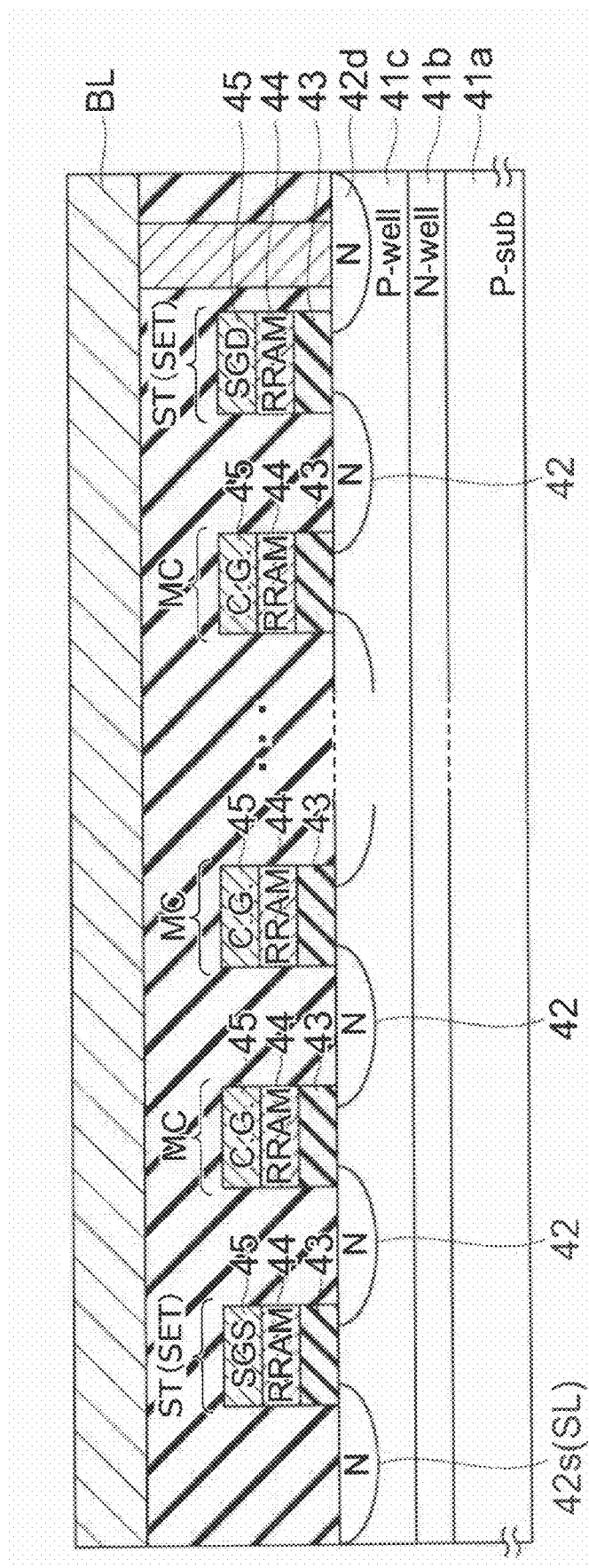
FIG. 18 is a schematic view illustrating the structure of the NAND cell unit according to the embodiment of the invention.

FIG. 18 is a schematic view illustrating the structure of the NAND cell unit according to this embodiment.

An N-type well region 41b and a P-type well region 41c are formed in a P-type semiconductor substrate 41a. The NAND cell unit according to the example of this embodiment is formed in the P-type well region 41c.

The NAND cell unit is formed from a NAND string made of multiple memory cells MC connected in series and a total of two select gate transistors ST with one connected to each end thereof.

The memory cells MC and the select gate transistors ST have the same structure. Specifically, the structure is formed from N-type diffusion layers 42, the gate insulation layer 43 on the channel region between the N-type diffusion layers 42, the recording layer (RRAM) 44 on the gate insulation layer 43, and the control gate electrode 45 on the recording layer 44.

It is possible to change the state (insulator/conductor) of the recording layer 44 of the memory cell MC by the basic operations described above. On the other hand, the recording layer 44 of the select gate transistor ST is fixed in the set state, that is, as a conductor (small resistance).

One of the select gate transistors ST is connected to a source line SL and the other one is connected to a bit line BL.

It is taken that all of the memory cells in the NAND cell unit are in the reset state (large resistance) prior to the set (the writing) operation.

The set (the writing) operation is performed from the memory cell MC on the source line SL side one at a time in turn toward the memory cell on the bit line BL side.

V1 (positive potential) is applied to the selected word line (control gate electrode) WL as a writing potential; and Vpass is applied to the unselected word lines WL as a transfer potential (a potential to switch the memory cell MC ON).

The select gate transistor ST on the source line SL side is switched OFF, the select gate transistor ST on the bit line BL side is switched ON, and program data is transferred from the bit line BL to the selected memory cell MC channel region.

For example, when the program data is a "1," a write-protect potential (e.g., a potential about the same as V1) is transferred to the channel region of the selected memory cell MC, and the resistance value of the recording layer 44 of the selected memory cell MC is prevented from changing from the high state to the low state.

When the program data is a "0," V2 (<V1) is transferred to the channel region of the selected memory cell MC and the resistance value of the recording layer 44 of the selected memory cell MC is changed from the high state to the low state.

In the reset (the erasing) operation, for example, V1' is applied to all of the word lines (the control gate electrodes) WL, and all of the memory cells MC in the NAND cell unit are switched ON. Then, the two select gate transistors ST are switched ON, V3 is applied to the bit line BL, and V4 (<V3) is applied to the source line SL.

At this time, because hot electrons are implanted into the recording layers 44 of all of the memory cells MC in the NAND cell unit, the reset operation is collectively executed for all of the memory cells MC in the NAND cell unit.

In the reading operation, the reading potential (the positive potential) is applied to the selected word lines (control gate electrodes) WL; and a potential is applied to the unselected word lines (control gate electrodes) WL such that the memory cells MC are switched ON regardless of whether the data is a "0" or a "1."

Then, the two select gate transistors ST are switched ON and the reading current is supplied to the NAND string.

Because the selected memory cell MC is switched ON or OFF according to the value of the data stored therein when the reading potential is applied, the data can be read by, for example, detecting the change of the reading current.

Figure 19:
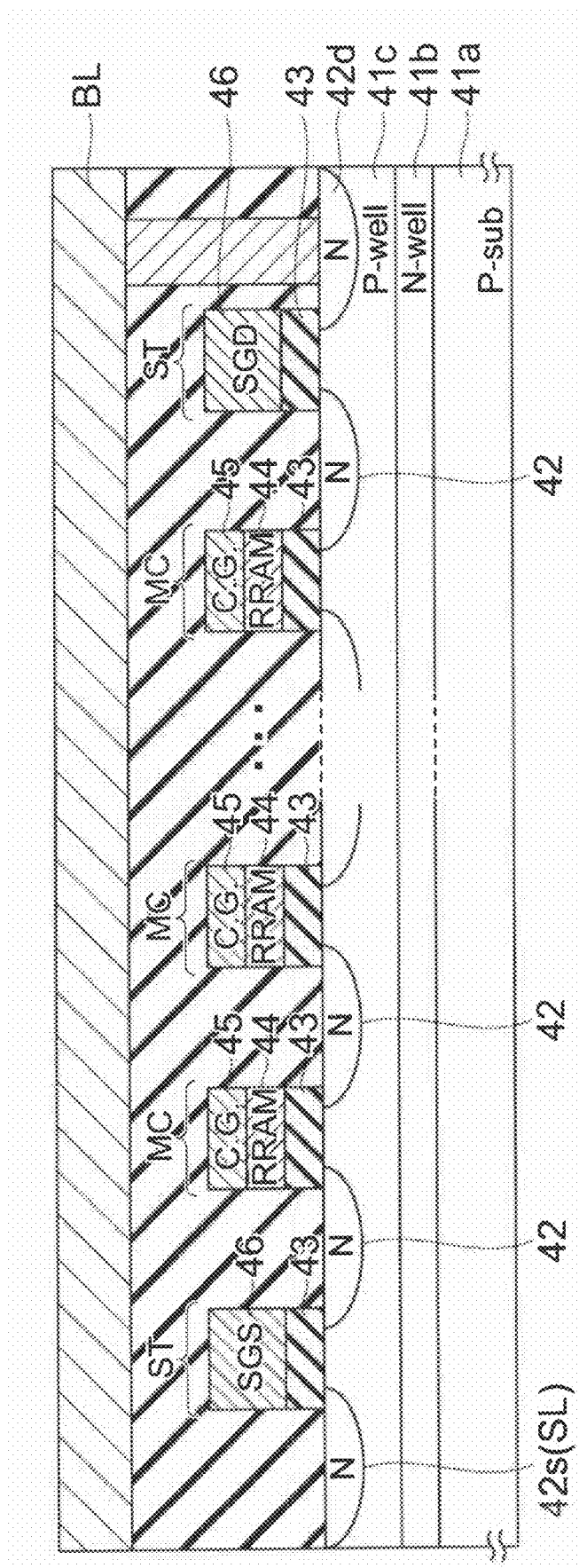
FIG. 19 is a schematic view illustrating a specific example based on normal MIS transistors.

Although the select gate transistors ST have the same structures as the memory cells MC in the structure illustrated in FIG. 18, the select gate transistors ST may also be, for example, normal MIS transistors without forming the recording layers as illustrated in FIG. 19.

Figure 20:
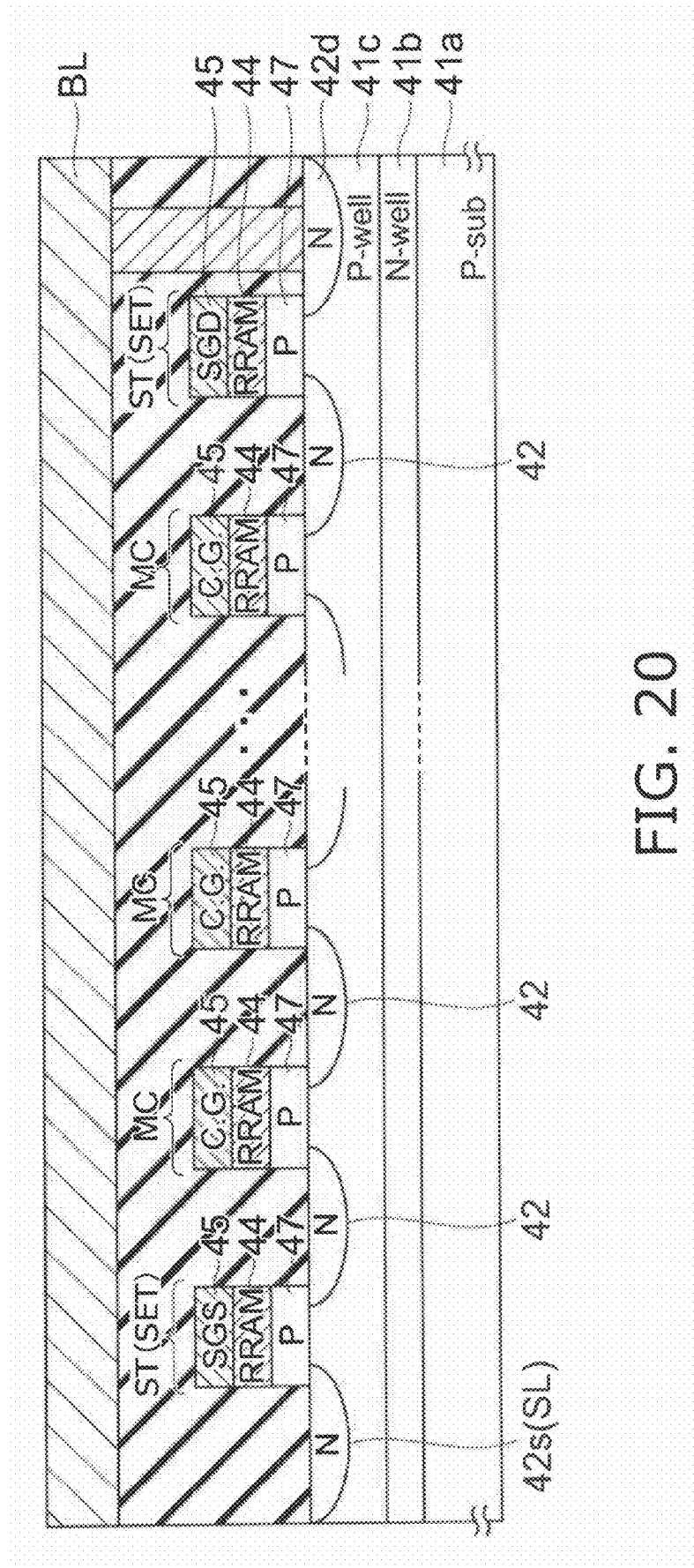
FIG. 20 is a schematic view illustrating a variation of the NAND flash memory.

FIG. 20 is a schematic view illustrating a variation of the NAND flash memory.

This variation has a structure in which the gate insulation layers of the multiple memory cells MC forming the NAND string are replaced by P-type semiconductor layers 47.

As high integration advances and the memory cells MC are downscaled, the P-type semiconductor layers 47 are filled by depletion layers in the state where a voltage is not applied.

During the setting (the writing), a positive writing potential (e.g., 3.5 V) is applied to the control gate electrode 45 of the selected memory cell MC, and a positive transfer potential (e.g., 1 V) is applied to the control gate electrodes 45 of the unselected memory cells MC.

At this time, the surfaces of the P-type well region 41c of the multiple memory cells MC in the NAND string are inverted from the P-type to the N-type, and channels are formed.

Then, as described above, the set operation can be performed by switching the select gate transistor ST on the bit line BL side ON and transferring the program data "0" from the bit line BL to the channel region of the selected memory cell MC.

The resetting (the erasing) can be collectively performed for all of the memory cells MC forming the NAND string by, for example, applying a negative erasing potential (e.g., −3.5 V) to all of the control gate electrodes 45 and applying the grounding potential (0 V) to the P-type well region 41c and the P-type semiconductor layers 47.

During the reading, a positive reading potential (e.g., 0.5 V) is applied to the control gate electrode 45 of the selected memory cell MC, and a transfer potential (e.g., 1 V) is applied to the control gate electrodes 45 of the unselected memory cells MC to switch the memory cells MC ON regardless of whether the data is a "0" or a "1."

However, a threshold voltage Vth "1" of the memory cells MC in the "1" state is taken to be in the range of 0 V<Vth "1"<0.5 V; and a threshold voltage Vth "0" of the memory cells MC in the "0" state is taken to be in the range of 0.5 V<Vth "0"<1 V.

Then, the two select gate transistors ST are switched ON and the reading current is supplied to the NAND string.

In such a state, the amount of current flowing in the NAND string changes according to the value of the data stored in the selected memory cell MC, and therefore the data can be read by detecting the change.

In this variation, it is desirable that the hole doping amount of the P-type semiconductor layer 47 is greater than that of the P-type well region 41c, and that the Fermi level of the P-type semiconductor layer 47 is about 0.5 V deeper than that of the P-type well region 41c.

This is because, when a positive potential is applied to the control gate electrode 45, the P-type starts inverting to the N-type from the surface portion of the P-type well region 41c between the N-type diffusion layers 42, and a channel is formed.

Thus, for example, during the writing, the channels of the unselected memory cells MC are formed only at the interface between the P-type well region 41c and the P-type semiconductor layers 47; and during the reading, the channels of the multiple memory cells MC in the NAND string are formed only at the interfaces between the P-type well region 41c and the P-type semiconductor layers 47.

That is, even in the case where the recording layer 44 of the memory cell MC is a conductor (the set state), the diffusion layers 42 and the control gate electrode 45 are not shorted.

(NOR Flash Memory)

Figure 21:
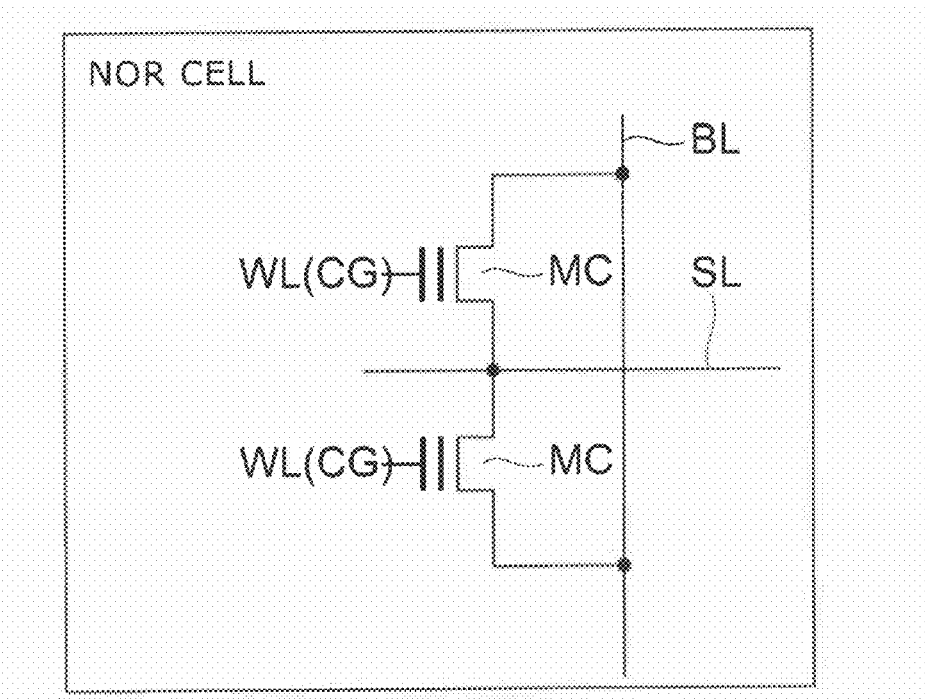
FIG. 21 is a circuit diagram of a NOR cell unit.

FIG. 21 is a circuit diagram of a NOR cell unit.

Figure 22:
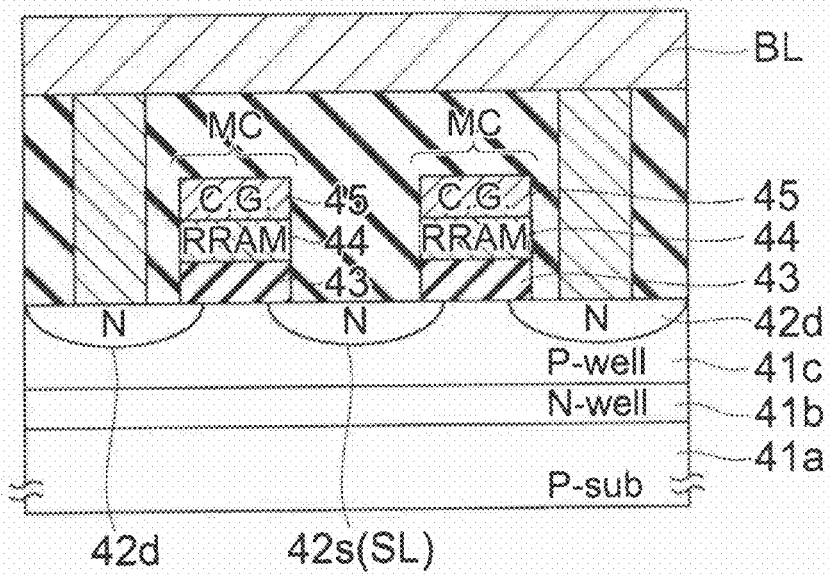
FIG. 22 is a schematic view illustrating the structure of the NOR cell unit according to the embodiment of the invention.

FIG. 22 is a schematic view illustrating the structure of the NOR cell unit according to an example of this embodiment.

The N-type well region 41b and the P-type well region 41c are formed in the P-type semiconductor substrate 41a. NOR cells according to the example of this embodiment are formed in the P-type well region 41c.

The NOR cell is formed from one memory cell (MIS transistor) MC connected between the bit line BL and the source line SL.

The memory cell MC is formed from the N-type diffusion layers 42, the gate insulation layer 43 on the channel region between the N-type diffusion layers 42, the recording layer (RRAM) 44 on the gate insulation layer 43, and the control gate electrode 45 on the recording layer 44.

It is possible to change the states (insulator/conductor) of the recording layer 44 of the memory cell MC by the basic operations described above.

(Two-Transistor Flash Memory)

Figure 23:
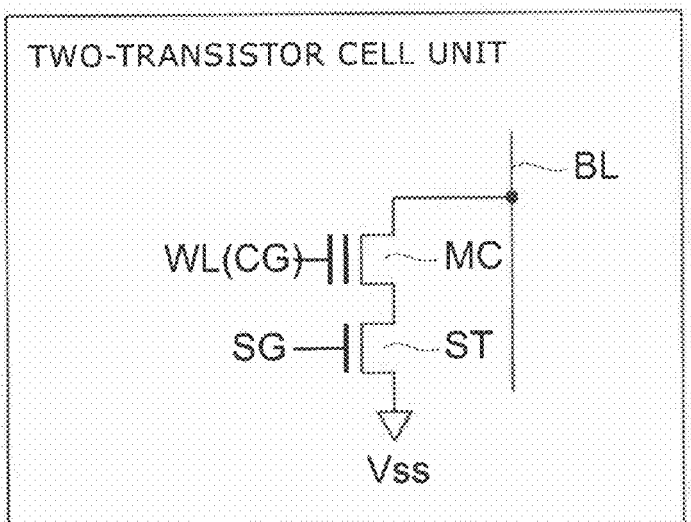
FIG. 23 is a circuit diagram of a two-transistor cell unit.

FIG. 23 is a circuit diagram of a two-transistor cell unit.

Figure 24:
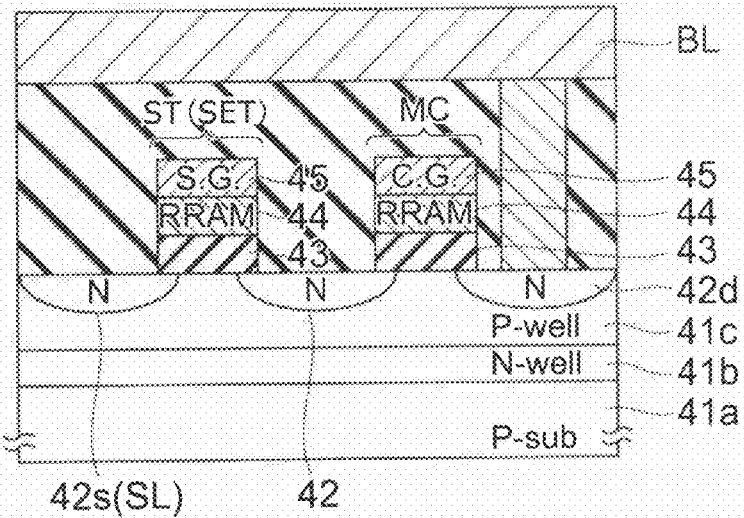
FIG. 24 is a schematic view illustrating the structure of the two-transistor cell unit according to the embodiment of the invention.

FIG. 24 is a schematic view illustrating the structure of the two-transistor cell unit according to the example of this embodiment.

The two-transistor cell unit is a recently developed new cell structure combining the characteristics of the NAND cell unit and characteristics of the NOR cell.

The N-type well region 41b and the P-type well region 41c are formed in the P-type semiconductor substrate 41a. The two-transistor cell unit according to the example of this embodiment is formed in the P-type well region 41c.

The two-transistor cell unit is formed from one memory cell MC and one select gate transistor ST connected in series.

The memory cell MC and the select gate transistor ST have the same structure. Specifically, the structure is formed from the N-type diffusion layers 42, the gate insulation layer 43 on the channel region between the N-type diffusion layers 42, the recording layer (RRAM) 44 on the gate insulation layer 43, and the control gate electrode 45 on the recording layer 44.

It is possible to change the states (insulator/conductor) of the recording layer 44 of the memory cell MC by the basic operations described above. On the other hand, the recording layer 44 of the select gate transistors ST is fixed in the set state, that is, as a conductor (small resistance).

The select gate transistor ST is connected to the source line SL; and the memory cell MC is connected to the bit line BL.

It is possible to change the states (insulator/conductor) of the recording layer 44 of the memory cell MC by the basic operations described above.

Figure 25:
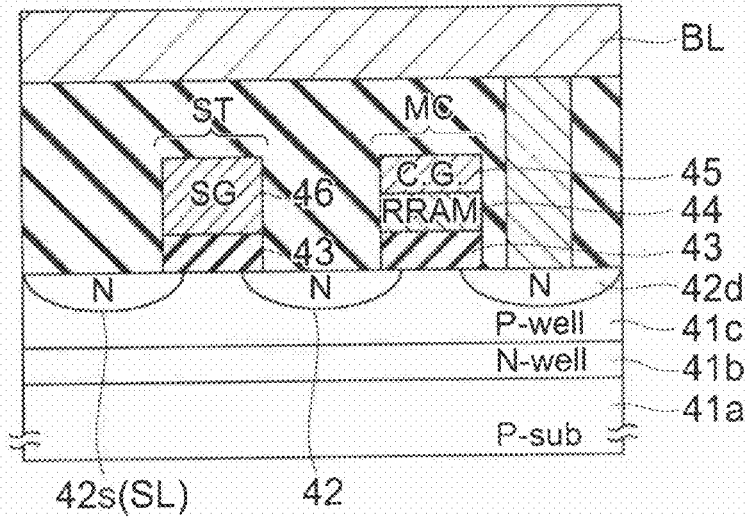
FIG. 25 is a schematic view illustrating a specific example based on normal MIS transistors.

Although the select gate transistor ST of the structure illustrated in FIG. 24 has the same structure as that of the memory cell MC, the select gate transistor ST may be, for example, a normal MIS transistor without forming the recording layer as illustrated in FIG. 25.

Next, experimental examples in which several samples are created and the resistance differences between the initial (the erased) state and the recorded (the written) state are evaluated will be described.

For simplification, the recording unit of either the first or second embodiment was formed on a disk made of a glass substrate having a diameter of about 60 mm and a thickness of about 1 mm to form the samples.

FIRST EXPERIMENTAL EXAMPLE

The sample of the first experimental example is as follows.

The recording unit has a structure in which a buffer layer (foundation layer), an electrode layer, a recording layer, and a protective layer are stacked. After stacking a buffer layer of $CeO_2$ formed on the disk with a thickness of about 50 nm, a TiN film of 100 nm is stacked to form the electrode layer. The recording layer is $NiTiO_3$, and the protective layer is diamond-like carbon (DLC).

The $NiTiO_3$ is formed, for example, with a thickness of about 10 nm on the disk by maintaining the disk temperature at a value in the range of 600° C. to 900° C. and performing RF magnetron sputtering in a 95.5% Ar and 0.5% $O_2$ atmosphere. The diamond-like carbon is formed, for example, with a thickness of about 3 nm on the $NiTiO_3$ by CVD.

The evaluation of the samples is performed using a sharp probe made of tungsten (W) and having a tip diameter of no more than 10 nm.

The tip of the probe is brought into contact with the surface of the recording unit; for the writing, a 1 V voltage pulse having a width of 10 nsec is applied between the electrode layer and the probe; and for the erasing, a 0.2 V voltage pulse having a width of 100 nsec is applied between the electrode layer and the probe.

A 0.1 V voltage pulse having a width of 10 nsec was applied between the electrode layer and the probe after each of the writing/erasing, and the measurements of the resistance value of the recording layer showed that while the value was about $10^7 \Omega$ in the initial (the erased) state, the value changed to about $10^3 \Omega$ in the recorded (the written) state.

The ratio of the resistance values of the writing/erasing was about $10^4 \Omega$, and it was confirmed that a sufficient margin can be ensured during the reading.

SECOND EXPERIMENTAL EXAMPLE

In the second experimental example, the same sample as that of the first experimental example is used except for the point that the recording layer was $NiAl_{0.5}Ta_{0.5}O_3$. Also, the manufacturing method and the evaluation method are performed similarly to the first experimental example.

The resistance values after the writing/erasing were about $10^3 \Omega$/about $10^7 \Omega$ similarly to the first experimental example; the resistance ratio of the two was about $10^4 \Omega$; and it was confirmed that a sufficient margin can be ensured during the reading.

THIRD EXPERIMENTAL EXAMPLE

In the third experimental example, the same sample as that of the first experimental example is used except for the point that the recording layer was $Ni_{1.1}Ti_{0.9}O_3$. Also, the manufacturing method and the evaluation method are performed similarly to the first experimental example.

The resistance values after the writing/erasing were about $10^3 \Omega$/about $10^7 \Omega$ similarly to the first experimental example;

the resistance ratio of the two was about $10^4 \Omega$; and it was confirmed that a sufficient margin can be ensured during the reading.

FOURTH EXPERIMENTAL EXAMPLE

In the fourth experimental example, the same sample as that of the first experimental example is used except for the point that the recording layer was $NiMnO_3$. Also, the manufacturing method and the evaluation method are performed similarly to the first experimental example.

The resistance values after the writing/erasing were about $10^3 \Omega$/about $10^7 \Omega$ similarly to the first experimental example; the resistance ratio of the two was about $10^4 \Omega$; and it was confirmed that a sufficient margin can be ensured during the reading.

FIFTH EXPERIMENTAL EXAMPLE

In the fifth experimental example, the same sample as that of the first experimental example is used except for the point that the recording layer was $ZnTiO_3$. Also, the manufacturing method and the evaluation method are performed similarly to the first experimental example.

The resistance values after the writing/erasing were about $10^3 \Omega$/about $10^7 \Omega$ similarly to the first experimental example; the resistance ratio of the two was about $10^4 \Omega$; and it was confirmed that a sufficient margin can be ensured during the reading.

SIXTH EXPERIMENTAL EXAMPLE

In the sixth experimental example, the same sample as that of the first experimental example is used except for the point that the electrode layer was $ZnCo_{0.5}Ta_{0.5}O_3$. Also, the manufacturing method and the evaluation method are performed similarly to the first experimental example.

The resistance values after the writing/erasing were about $10^3 \Omega$/about $10^7 \Omega$ similarly to the first experimental example; the resistance ratio of the two was about $10^4 \Omega$; and it was confirmed that a sufficient margin can be ensured during the reading.

SEVENTH EXPERIMENTAL EXAMPLE

In the seventh experimental example, the same sample as that of the first experimental example is used except for the point that the foundation layer was $Si_3N_4$. Also, the manufacturing method and the evaluation method are performed similarly to the first experimental example.

The resistance values after the writing/erasing were about $10^3 \Omega$/about $10^7 \Omega$ similarly to the first experimental example; the resistance ratio of the two was about $10^4 \Omega$; and it was confirmed that a sufficient margin can be ensured during the reading.

EIGHTH EXPERIMENTAL EXAMPLE

In the eighth experimental example, the same sample as that of the first experimental example is used except for the point that the recording layer was $NiCr_{0.5}Nb_{0.5}O_3$. Also, the manufacturing method and the evaluation method are performed similarly to the first experimental example.

The resistance values after the writing/erasing were about $10^3 \Omega$/about $10^7 \Omega$ similarly to the first experimental example; the resistance ratio of the two was about $10^4 \Omega$; and it was confirmed that a sufficient margin can be ensured during the reading.

NINTH EXPERIMENTAL EXAMPLE

In the ninth experimental example, the same sample as that of the first experimental example is used except for the point that the recording layer was $NiCo_{0.5}Ta_{0.5}O_3$. Also, the manufacturing method and the evaluation method are performed similarly to the first experimental example.

The resistance values after the writing/erasing were about $10^3 \Omega$/about $10^7 \Omega$ similarly to the first experimental example; the resistance ratio of the two was about $10^4 \Omega$; and it was confirmed that a sufficient margin can be ensured during the reading.

TENTH EXPERIMENTAL EXAMPLE

In the tenth experimental example, the same sample as that of the first experimental example is used except for the point that the recording layer was $NiAl_{0.5}Nb_{0.5}O_3$. Also, the manufacturing method and the evaluation method are performed similarly to the first experimental example.

The resistance values after the writing/erasing were about $10^3 \Omega$/about $10^7 \Omega$ similarly to the first experimental example; the resistance ratio of the two was about $10^4 \Omega$; and it was confirmed that a sufficient margin can be ensured during the reading.

ELEVENTH EXPERIMENTAL EXAMPLE

In the eleventh experimental example, after forming a buffer layer (foundation layer) including $CeO_2$ with a thickness of about 50 nm, an electrode layer including TiN is formed with a thickness of about 100 nm. A word line is formed on the electrode layer, and a vertical diode is formed on the word line.

Further, a platinum layer of about 10 nm is formed on the vertical diode, $NiTiO_3$ is formed on the platinum layer as the recording layer, and $TiO_2$ of about 10 nm having vacant sites is formed on the recording layer as the second compound. After an electrode layer of about 100 nm including TiN is again formed on the second compound, a bit line is formed on the electrode layer.

Except for the point that a potential is applied between the word line and the bit line, measurements were implemented similarly to the first experimental example.

The resistance values after the writing/erasing were about $10^3 \Omega$/about $10^7 \Omega$ similarly to the first experimental example; the resistance ratio of the two was about $10^4 \Omega$; and it was confirmed that a sufficient margin can be ensured during the reading.

TWELFTH EXPERIMENTAL EXAMPLE

In the twelfth experimental example, except for the point that the recording layer was $NiCo_{0.5}Ta_{0.5}O_3$, the same sample as that of the eleventh experimental example is used. Also, the manufacturing method and the evaluation method are performed similarly to the first experimental example.

While the resistance value of the initial state was about $10^8 \Omega$, the resistance value after the writing was about $10^3 \Omega$; and further, the resistance value after the erasing was about $10^7 \Omega$. The resistance ratio of the writing/erasing was $10^4 \Omega$ to $10^5 \Omega$, and it was confirmed that a sufficient margin can be ensured during the reading.

THIRTEENTH EXPERIMENTAL EXAMPLE

In the thirteenth experimental example, the same sample as that of the first experimental example is used except for the point that the protective layer was $SO_2$. Also, the manufacturing method and the evaluation method are performed similarly to the first experimental example.

While the resistance value of the initial state was about $10^7 \Omega$, the resistance value after the writing was about $10^3 \Omega$; and further, the resistance value after the erasing was about $10^5 \Omega$. The resistance ratio of the writing/erasing was $10^2 \Omega$ to $10^5 \Omega$, and it was confirmed that a sufficient margin can be ensured during the reading.

FOURTEENTH EXPERIMENTAL EXAMPLE

In the fourteenth experimental example, the same sample as that of the first experimental example is used except for the point that the buffer layer (the foundation layer) was $Tb_4O_7$ and the electrode layer was $LaNiO_3$. Also, the manufacturing method and the evaluation method are performed similarly to the first experimental example.

While the resistance value of the initial state was about $10^6 \Omega$, the resistance value after the writing was about $10^2 \Omega$; and further, the resistance value after the erasing was about $10^6 \Omega$. The resistance ratio of the writing/erasing was about $10^4 \Omega$, and it was confirmed that a sufficient margin can be ensured during the reading.

FIFTEENTH EXPERIMENTAL EXAMPLE

In the fifteenth experimental example, the same sample as that of the first experimental example is used except for the point that the buffer layer (the foundation layer) was $Ta_2O_5$. Also, the manufacturing method and the evaluation method are performed similarly to the first experimental example.

While the resistance value of the initial state was about $10^8 \Omega$, the resistance value after the writing was about $10^3 \Omega$; and further, the resistance value after the erasing was about $10^8 \Omega$. The resistance ratio of the writing/erasing was about $10^5 \Omega$, and it was confirmed that a sufficient margin can be ensured during the reading.

SIXTEENTH EXPERIMENTAL EXAMPLE

In the sixteenth experimental example, the same sample as that of the first experimental example is used except for the point that the electrode layer was $RuO_2$. Also, the manufacturing method and the evaluation method are performed similarly to the first experimental example.

While the resistance value of the initial state was about $10^8 \Omega$, the resistance value after the writing was about $10^3 \Omega$; and further, the resistance value after the erasing was about $10^8 \Omega$. The resistance ratio of the writing/erasing was about $10^5 \Omega$, and it was confirmed that a sufficient margin can be ensured during the reading.

As described above, for the samples of each of the first to sixteenth experimental examples as well, the basic operations of writing, erasing, and reading are possible.

FIG. 29 is a table summarizing the verification results of the first to sixteenth experimental examples.

As described hereinabove with reference to FIG. 1 to FIG. 28 and FIG. 29, according to these embodiments, information recording (writing) can be performed only at the portion where the electric field is applied (the unit of recording), and therefore the recording of information is possible to an exceedingly minute region with exceedingly little power consumption.

Also, although the erasing is performed by applying heat, almost no structural change of the oxide occurs if the materials proposed in the examples of these embodiments are used; and therefore, the erasing is possible with little power consumption. Alternatively, the erasing also can be performed by applying an electric field having an orientation reversed from that during the recording. In such a case, erasing is possible with less power consumption because energy losses of diffused heat are low.

Thus, according to the examples of these embodiments, information recording at a recording density not attainable by conventional art is possible despite having an exceedingly simple configuration. Accordingly, the examples of these embodiments have considerable industrial merits as a next-generation technology to break through the wall of the recording density of conventional nonvolatile memory.

The examples of these embodiments are not limited to the embodiments described above and can be realized by modifying the components in a scope that does not depart from the purport thereof. Also, although set and reset are defined in the examples of these embodiments where the state directly after forming the films is the initial state, the definitions of set and reset are arbitrary and not limited to the examples of these embodiments. Further, various inventions can be formed by appropriate combinations of the multiple components disclosed in the embodiments described above. For example, some of the components may be deleted from all of the components disclosed in the embodiments described above, and components of different embodiments may be appropriately combined.

INDUSTRIAL APPLICABILITY

According to the invention, a non-volatile information recording and reproducing apparatus having high recording density and low power consumption can be provided.

The invention claimed is:

1. An information recording and reproducing apparatus, comprising:
   a stacked structure including an electrode layer and a recording layer;
   a buffer layer added to the electrode layer; and
   a voltage application unit configured to apply a voltage to the recording layer, produce a phase change in the recording layer, and record information,
   the recording layer including a first layer including a first compound having an ilmenite structure represented by $A_xM_yX_3$ ($0.1 \leq x \leq 1.1$ and $0.75 \leq y \leq 1$), the A and the M being mutually different elements, at least one selected from the A and the M being a transition element having a d orbit incompletely filled by electrons, the A being an element including at least one selected from the group consisting of Be, Mg, Fe, Co, Ni, Cu, and Zn, the M being an element including at least one selected from the group consisting of Ti, Ge, Sn, V, Cr, Mn, Fe, Co, Ni, Nb, Ta, Mo, W, Re, Ru, and Rh, the X being an element including at least one selected from the group consisting of O (oxygen) and N (nitrogen).

2. The apparatus according to claim 1, wherein a c axis of a crystal of the structure of the recording layer is oriented in a horizontal direction with respect to a film surface or within 45 degrees from the horizontal direction.

3. The apparatus according to claim 1, wherein the A is an element including at least one selected from the group consisting of Ni, Zn, and Mg and the M is an element or a compound including at least one selected from the group consisting of Mn, $Co_{0.5}Nb_{0.5}$, $Co_{0.5}Ta_{0.5}$, $Fe_{0.5}Nb_{0.5}$, and $Fe_{0.5}Ta_{0.5}$.

4. The apparatus according to claim 1, wherein
the recording layer further includes a second layer provided in contact with the first layer, and
the second layer includes a vacant site capable of containing the X or the A.

5. The apparatus according to claim 4, wherein
the second layer includes a second compound, and
the second compound is a compound represented by $\square_xMZ_2$ ($0.3 \leq x \leq 1$), the $\square$ being a vacant site containing the X or the A, the M being an element including at least one selected from the group consisting of Ti, V, Cr, Mn, Fe, Co, Ni, Nb, Ta, Mo, W, Re, Ru, and Rh, the Z being an element including at least one selected from the group consisting of O, S, Se, N, Cl, Br, and I.

6. The apparatus according to claim 4, wherein
the second layer includes a second compound, and
the second compound is a compound represented by $\square_xMZ_3$ ($1 \leq x \leq 2$), the $\square$ being a vacant site containing the X or the A, the M being an element including at least one selected from the group consisting of Ti, V, Cr, Mn, Fe, Co, Ni, Nb, Ta, Mo, W, Re, Ru, and Rh, the Z being an element including at least one selected from the group consisting of O, S, Se, N, Cl, Br, and I.

7. The apparatus according to claim 4, wherein
the second layer includes a second compound, and
the second compound is a compound represented by $\square_xMZ_4$ ($1 \leq x \leq 2$), the $\square$ being a vacant site containing the X or the A, the M being an element including at least one selected from the group consisting of Ti, V, Cr, Mn, Fe, Co, Ni, Nb, Ta, Mo, W, Re, Ru, and Rh, the Z being an element including at least one selected from the group consisting of O, S, Se, N, Cl, Br, and I.

8. The apparatus according to claim 4, wherein
the second layer includes a second compound, and
the second compound is a compound represented by $\square_xMPO_z$ ($0.3 \leq x \leq 3$ and $4 \leq z \leq 6$), the $\square$ being a vacant site containing the X or the A, the M being an element including at least one selected from the group consisting of Ti, V, Cr, Mn, Fe, Co, Ni, Nb, Ta, Mo, W, Re, Ru, and Rh, the P being the element phosphorus, the O being the element oxygen.

9. The apparatus according to claim 4, wherein the second compound has a structure including at least one selected from the group consisting of hollandite structure, ramsdellite structure, anatase structure, brookite structure, pyrolusite structure, $ReO_3$ structure, $MoO_{1.5}PO_4$ structure, $TiO_{0.5}PO_4$ structure and $FePO_4$ structure, $\beta MnO_2$ structure, $\gamma MnO_2$ structure, $\lambda MnO_2$ structure, spinel structure, and ilmenite structure.

10. The apparatus according to claim 9, wherein the second compound has an ilmenite structure.

11. The apparatus according to claim 1, wherein the voltage application unit includes a probe configured to locally apply the voltage to a unit of recording of the recording layer.

12. The apparatus according to claim 1, wherein the voltage application unit includes a word line and a bit line disposed on either side of the recording layer.

13. The apparatus according to claim 1, wherein
the voltage application unit includes a MIS transistor including a gate electrode and a gate insulating film, and
the recording layer is provided between the gate electrode and the gate insulation layer of the MIS transistor.

14. The apparatus according to claim 1, wherein the voltage application unit includes:
two second conductivity type diffusion layers provided in a first conductivity type semiconductor substrate and a first conductivity type semiconductor layer on the first conductivity type semiconductor substrate between the two second conductivity type diffusion layers; and
a gate electrode controlling conduction/nonconduction between the two second conductivity type diffusion layers,
the recording layer being disposed between the gate electrode and the first conductivity type semiconductor layer.

* * * * *